United States Patent
Yamashita et al.

(10) Patent No.: US 10,622,532 B2
(45) Date of Patent: Apr. 14, 2020

(54) THERMOELECTRIC CONVERSION MODULE AND METHOD OF MANUFACTURING THE SAME

(71) Applicant: Mitsubishi Electric Corporation, Chiyoda-ku (JP)

(72) Inventors: Akira Yamashita, Chiyoda-ku (JP); Hidetada Tokioka, Chiyoda-ku (JP); Takayuki Morioka, Chiyoda-ku (JP); Kunihiko Nishimura, Chiyoda-ku (JP); Shinya Nishimura, Chiyoda-ku (JP); Mutsumi Tsuda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 19 days.

(21) Appl. No.: 16/070,713

(22) PCT Filed: Dec. 9, 2016

(86) PCT No.: PCT/JP2016/086777
§ 371 (c)(1),
(2) Date: Jul. 17, 2018

(87) PCT Pub. No.: WO2017/141525
PCT Pub. Date: Aug. 24, 2017

(65) Prior Publication Data
US 2020/0028048 A1     Jan. 23, 2020

(30) Foreign Application Priority Data
Feb. 18, 2016     (JP) .................................. 2016-028908

(51) Int. Cl.
*H01L 35/04*     (2006.01)
*H01L 35/30*     (2006.01)
*H01L 35/34*     (2006.01)

(52) U.S. Cl.
CPC .............. *H01L 35/04* (2013.01); *H01L 35/30* (2013.01); *H01L 35/34* (2013.01)

(58) Field of Classification Search
CPC .......... H01L 35/04; H01L 35/30; H01L 35/34
(Continued)

(56) References Cited

U.S. PATENT DOCUMENTS

2004/0076214 A1* 4/2004 Bell ..................... F02G 1/043
                                                              374/13
2009/0236087 A1* 9/2009 Horio ..................... H01L 35/30
                                                              165/185

(Continued)

FOREIGN PATENT DOCUMENTS

| JP | 200035825     | * | 2/2000  | ............ Y02T 10/16 |
| JP | 2009-267316 A |   | 11/2009 |                         |
| JP | 2012-39858 A  |   | 2/2012  |                         |

OTHER PUBLICATIONS

English Machine Translation of Japanese Patent JP 2000/035825 (Year: 2000).*

(Continued)

*Primary Examiner* — Dzung Tran
(74) *Attorney, Agent, or Firm* — Oblon, McClelland, Maier & Neustadt, L.L.P.

(57) ABSTRACT

A thermoelectric conversion module includes a plurality of thermoelectric conversion elements formed on a first main surface of an inner tube, and a plurality of projections formed on a second main surface of an outer tube. The thermoelectric conversion element includes an interconnection, and an electrode formed at a first distance from the second main surface in a second direction. When the thermoelectric conversion module is seen from a first direction, the projections include a first projection and a second projection formed at a spacing therebetween in a third direction. A shortest distance between a first lateral surface (Continued)

and a top portion of the first projection and a shortest distance between a second lateral surface and a top portion of the second projection are smaller than the first distance.

8 Claims, 21 Drawing Sheets

(58) Field of Classification Search
USPC .......................................................... 257/467
See application file for complete search history.

(56) References Cited

U.S. PATENT DOCUMENTS

| 2010/0031987 A1* | 2/2010 | Bell ................... H01L 23/3735 |
| | | 136/200 |
| 2012/0031067 A1 | 2/2012 | Sundaram et al. |
| 2012/0312029 A1* | 12/2012 | Brehm ................. F24H 3/0429 |
| | | 62/3.3 |

OTHER PUBLICATIONS

International Search Report dated Feb. 28, 2017 in PCT/JP2016/086777 filed Dec. 9, 2016.

* cited by examiner

THERMOELECTRIC CONVERSION MODULE AND METHOD OF MANUFACTURING THE SAME

BACKGROUND OF THE INVENTION

Field of the Invention

The present invention relates to a thermoelectric conversion module and a method of manufacturing the same.

Description of the Background Art

With increased awareness toward global environmental issues such as global warming, the utilization of unused heat is gaining increased attention. One of the techniques capable of recovering energy from exhaust heat is thermoelectric generation using a thermoelectric conversion module formed of thermoelectric elements. Thermoelectric generation can convert the exhaust heat from an exhaust gas caused by a turbine engine into useful electricity. In this case, a thermoelectric conversion module is fixed to, for example, a wall surface of an exhaust pipe (case) through which exhaust air flows. A hot junction of the thermoelectric conversion module is formed at, for example, a position away from the wall surface of the exhaust pipe by the dimensions of the thermoelectric elements.

Japanese Patent Laying-Open No. 2012-39858 discloses a system including a turbulence device formed of thermoelectric elements fixed to a wall surface of a case in order to generate a turbulent flow of exhaust heat.

CITATION LIST

Patent Document

PTD 1: Japanese Patent Laying-Open No. 2012-39858

SUMMARY OF THE INVENTION

Technical Problem

However, a region close to the wall surface in the exhaust pipe has a high flow resistance compared with a central portion therein. A conventional thermoelectric conversion module fixed to the wall surface of the exhaust pipe thus has a decreased flow rate and a decreased temperature of the exhaust gas around the thermoelectric conversion module. This makes it difficult to provide a maximum temperature in the exhaust pipe around the hot junction, resulting in an insufficiently large temperature difference between the hot junction and a cold junction.

In the system described in Japanese Patent Laying-Open No. 2012-39858, the turbulence device produces turbulent flows around the hot junction and the cold junction. This causes the exhaust gas to strike the portions (such as lateral surfaces) of each thermoelectric element other than the hot junction. It is thus difficult to provide a maximum temperature in the exhaust pipe around the hot junction, and the temperature difference between the hot junction and the cold junction cannot be increased sufficiently.

The present invention has been made to solve the above problem. A main object of the present invention is to provide a thermoelectric conversion module capable of providing a sufficiently large temperature difference between a hot junction and a cold junction.

Solution to Problem

A thermoelectric conversion module according to the present invention is a thermoelectric conversion module that converts the heat of a fluid circulating in a first direction into electrical energy. The thermoelectric module according to the present invention includes a first frame body having a first main surface extending in the first direction, a second frame body facing the first main surface in a second direction crossing the first direction and having a second main surface extending in the first direction, at least one thermoelectric conversion element formed on the first main surface, and a plurality of projections formed on the second main surface. The thermoelectric conversion element includes a cold junction, a hot junction, and a first lateral surface and a second lateral surface formed between the hot junction and the cold junction. The cold junction is formed on the first main surface. The hot junction is located at a side closer to the second main surface with respect to the cold junction and is formed at a first distance from the second main surface in the second direction. The first lateral surface and the second lateral surface are formed at a spacing therebetween in a third direction crossing the first direction and the second direction. The projections include a first projection and a second projection formed at a spacing therebetween in the third direction when the thermoelectric conversion module is seen from the first direction. The first projection is formed at a spacing from the first lateral surface in the second direction the second projection is formed at a spacing from the second lateral surface in the second direction. The first projection and the second projection each have a bottom portion connected to the second main surface and a top portion located at a side closer to the first main surface with respect to the bottom portion. The hot junction is formed to be located between a first line segment and a second line segment when the thermoelectric conversion module is seen from the first direction. The first line segment passes through the bottom portion and the top portion of the first projection and extends along the second direction. The second line segment passes through the bottom portion and the top portion of the second projection and extends along the second direction. A shortest distance between the first lateral surface and the top portion of the first projection and a shortest distance between the second lateral surface and the top portion of the second projection are each smaller than the first distance.

A method of manufacturing a thermoelectric conversion module according to the present invention is a method of manufacturing a thermoelectric conversion module that converts heat of a fluid circulating in a first direction into electrical energy. The method includes preparing a first frame body having a first main surface extending in the first direction and including at least one thermoelectric conversion element formed on the first main surface, preparing a second frame body having a second main surface extending in the first direction and including a plurality of projections formed on the second main surface, and fixing the first frame body and the second frame body to each other such that the first main surface and the second main surface face each other in a second direction crossing the first direction. In the preparing of the first frame body, the thermoelectric conversion element including a cold junction, a hot junction, and a first lateral surface and a second lateral surface located between the hot junction and the cold junction is formed. The cold junction is formed on the first main surface. The hot junction is formed at a second distance from the cold junction in the second direction. The first lateral surface and the second lateral surface are formed at a spacing therebetween in a third direction crossing the first direction and the second direction. In the preparing of the second frame body, the projections including a first projection and a second projection formed at a spacing therebetween in the third direction are formed when the thermoelectric conversion module is seen from the first direction. The first projection and the second projection each have a bottom portion connected to the second main surface and a top portion located at a side closer to the first main surface with respect to the bottom portion. In the fixing, the first projection and the first lateral surface are arranged at a spacing therebetween in the second direction, and the second projection and the second lateral surface are arranged at a spacing therebetween in the second direction. Further, in the fixing, the first frame body and the second frame body are positioned such that the hot junction is located between a first line segment and a second line segment when the thermoelectric conversion module is seen from the first direction. The first line segment passes through the bottom portion and the top portion of the first projection and extends along the second direction. The second line segment passes through the bottom portion and the top portion of the second projection and extends along the second direction. Further, in the fixing, the first frame body and the second frame body are positioned such that a shortest distance between the first lateral surface and the top portion of the first projection and a shortest distance between the second lateral surface and the top portion of the second projection are each smaller than a shortest distance between the hot junction and the second main surface.

Advantageous Effects of Invention

The present invention can provide a thermoelectric conversion module capable of providing a sufficiently large temperature difference between a hot junction and a cold junction.

DESCRIPTION OF THE PREFERRED EMBODIMENTS

Embodiments of the present invention will be described below with reference to the drawings. The same or corresponding components are denoted by the same reference signs and a description thereof will not be repeated.

Embodiment 1

Configuration of Thermoelectric Conversion Module

Figure 1:
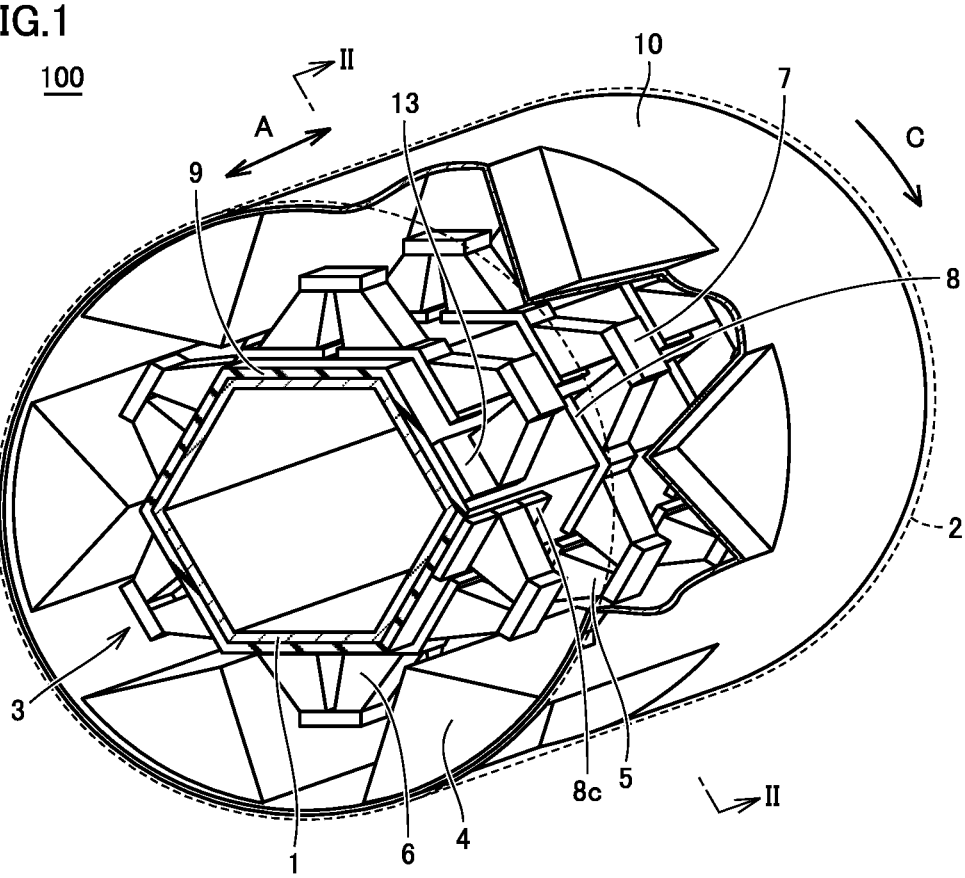
FIG. 1 is a perspective view of a thermoelectric conversion module according to Embodiment 1.
Figure 2:
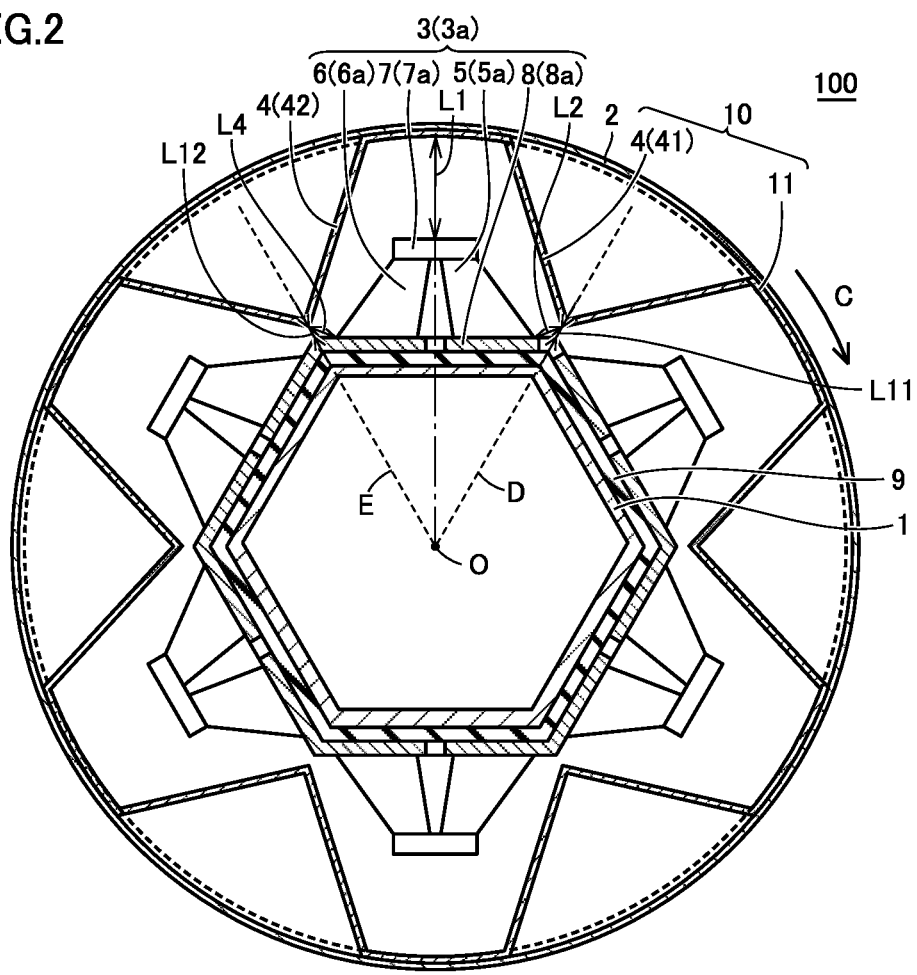
FIG. 2 is a sectional view of the thermoelectric conversion module according to Embodiment 1 which is perpendicular to a first direction.
Figure 3:
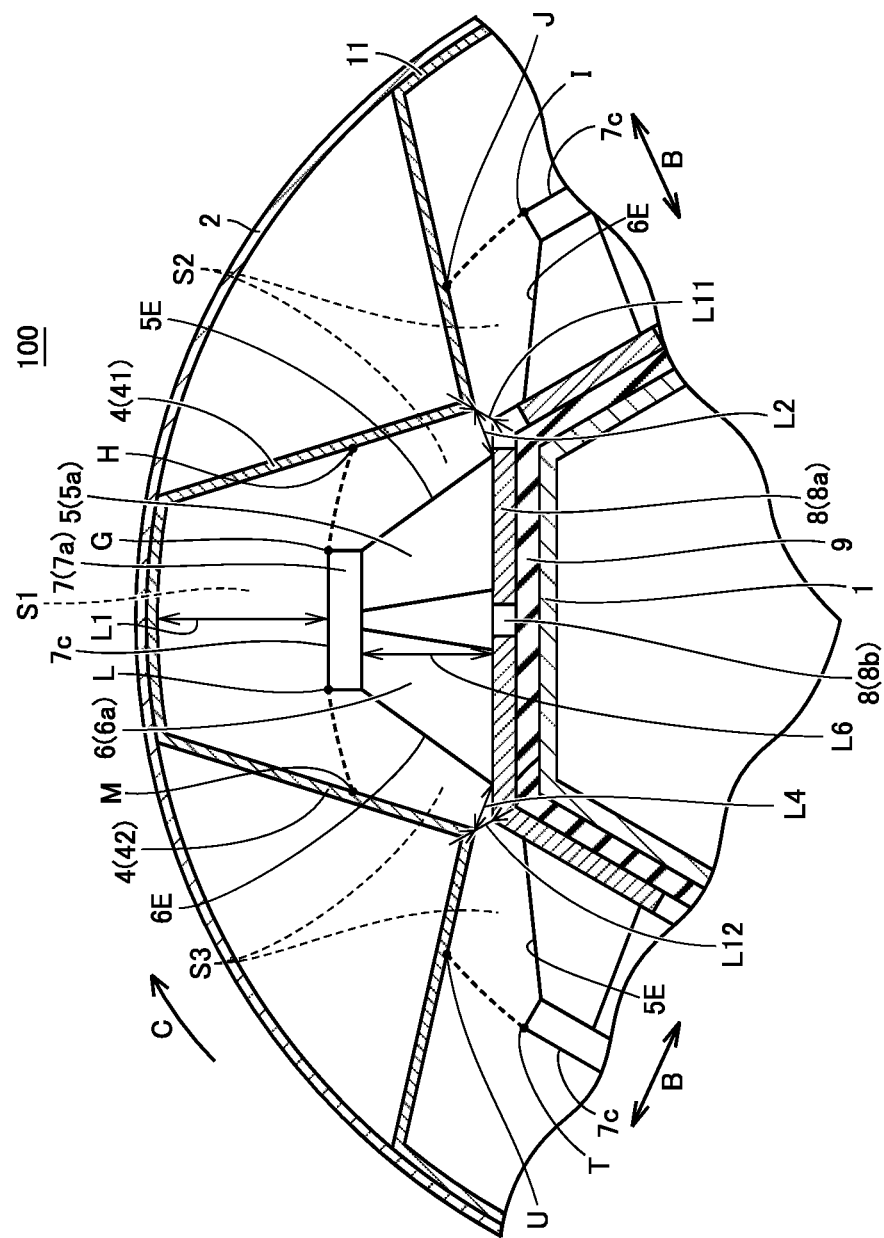
FIG. 3 is a partially enlarged view of the thermoelectric conversion module shown in FIG. 2.

With reference to FIGS. 1 to 3, a thermoelectric conversion module 100 according to Embodiment 1 will be described. Thermoelectric conversion module 100 provides thermoelectric elements with a temperature difference produced between a heating medium and a cooling medium circulating along a first direction A and extracts a resultant thermoelectromotive force generated in the thermoelectric elements. FIGS. 2 and 3 are sectional views of thermoelectric conversion module 100 which are perpendicular to first direction A.

Thermoelectric conversion module 100 mainly includes an inner tube 1 serving as a first frame body, an outer tube 2 serving as a second frame body, a plurality of thermoelectric conversion elements 3, and a plurality of projections 4. One thermoelectric conversion element 3 is a so-called π-type thermoelectric conversion element and includes a p-type thermoelectric element 5, an n-type thermoelectric element 6, an electrode 7 (hot junction), and an interconnection 8 (cold junction). In Embodiment 1, the axial direction of inner tube 1 and outer tube 2 is first direction A, the radial direction of inner tube 1 and outer tube 2 is a second direction B (see FIG. 3), and the circumferential direction of inner tube 1 and outer tube 2 is a third direction C.

Inner tube 1 is housed in outer tube 2. Inner tube 1 and outer tube 2 are formed such that, for example, their central axes O (see FIG. 2) coincide with each other. The outer circumferential surface of inner tube 1 faces the inner circumferential surface of outer tube 2 in second direction B. The heating medium is circulated through the space defined between the outer circumferential surface of inner tube 1 and the inner circumferential surface of outer tube 2. The cooling medium is circulated through the interior space of inner tube 1. Although inner tube 1 and outer tube 2 may have any sectional shapes perpendicular to first direction A, for example, inner tube 1 has a hexagonal sectional shape and outer tube 2 has a circular sectional shape. The outer circumferential surface of inner tube 1 is covered with an insulating film 9. A plate portion 10 is fixed to the inner circumferential surface of outer tube 2. A partial portion of plate portion 10 projects more than the remaining portion thereof, and the remaining portion is fixed to the inner circumferential surface of outer tube 2. That is to say, plate portion 10 has projections 4, namely the partial portion above, and valley portions 11, namely the remaining portion above (described below in detail). Herein, the surface of insulating film 9 which covers the outer circumferential surface of inner tube 1 is referred to as a first main surface. The inner circumferential surfaces of valley portions 11 of plate portion 10 fixed to the inner circumferential surface of outer tube 2 are referred to as a second main surface. When the sectional shape of inner tube 1 is a hexagonal shape, the first main surface has six planes.

As shown in FIGS. 1 to 3, each of thermoelectric conversion elements 3 is formed on each plane of the first main surface. Thermoelectric conversion elements 3 are formed, for example, at regular intervals in first direction A. Thermoelectric conversion elements 3 include a plurality of thermoelectric conversion elements 3a formed side by side at a spacing therebetween along third direction C. In other words, thermoelectric conversion elements 3 include a first thermoelectric conversion element group formed of thermoelectric conversion elements 3a formed side by side at a spacing therebetween along third direction C. The number of thermoelectric conversion elements 3a forming the first thermoelectric conversion element group is equal to, for example, the number of vertices of the sectional shape of inner tube 1 perpendicular to first direction A.

As shown in FIG. 1, a plurality of the first thermoelectric conversion element groups, each of which is formed of thermoelectric conversion elements 3a arranged side by side along third direction C, are formed in first direction A. The first thermoelectric conversion element groups are formed at a spacing therebetween in first direction A.

Figure 4:
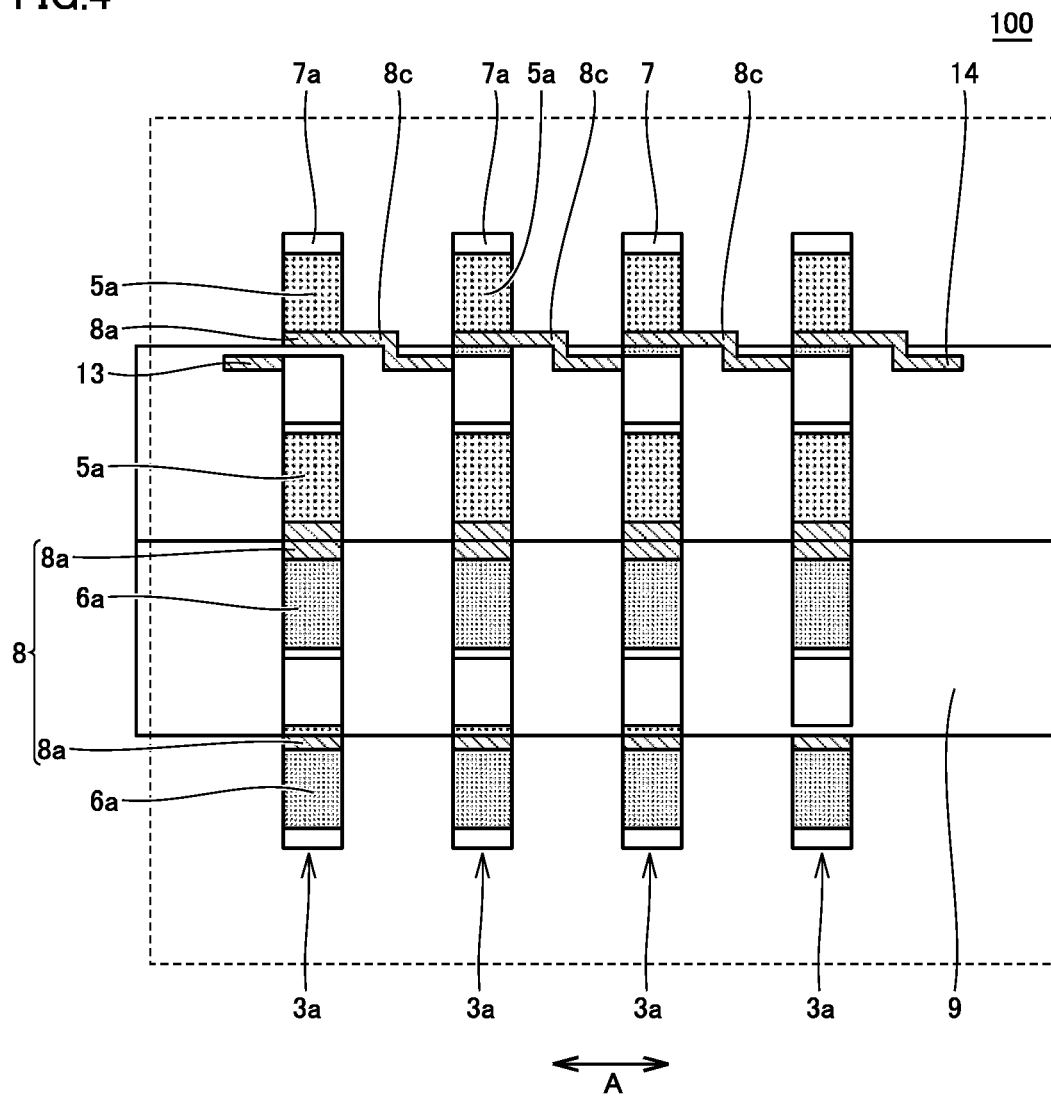
FIG. 4 is a side view of the thermoelectric conversion module according to Embodiment 1.
Figure 5:
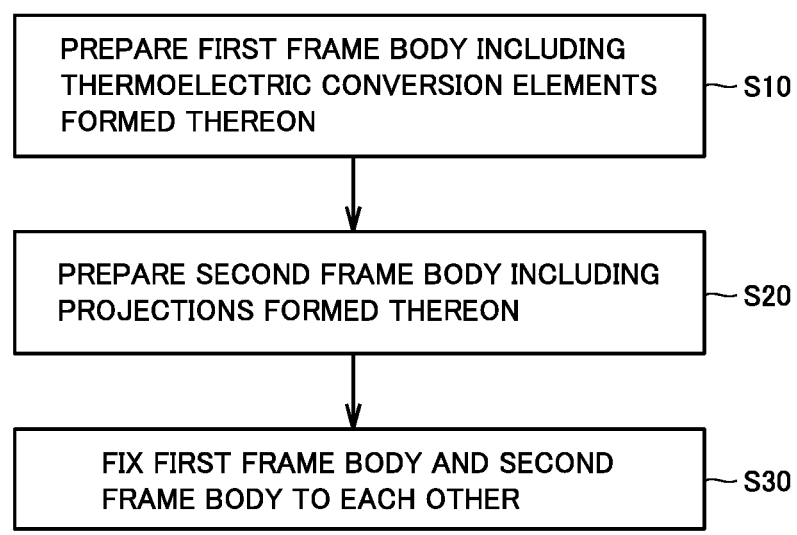
FIG. 5 is a flowchart of a method of manufacturing the thermoelectric conversion module according to Embodiment 1.

As shown in FIGS. 3 and 4, thermoelectric conversion elements 3a forming the first thermoelectric conversion element group have a similar configuration. In other words, thermoelectric conversion elements 3 are formed to be rotationally symmetrical about central axis O.

As shown in FIGS. 3 and 4, thermoelectric conversion elements 3a each include a p-type thermoelectric element 5a, an n-type thermoelectric element 6a, an electrode 7a, and an interconnection 8a. P-type thermoelectric element 5a and n-type thermoelectric element 6a of each of thermoelectric conversion elements 3a are formed on the same plane of the first main surface. A plurality of p-type thermoelectric elements 5a and a plurality of n-type thermoelectric elements 6a are formed in third direction C P-type thermoelectric elements 5a and n-type thermoelectric elements 6a are arranged alternately in third direction C P-type thermoelectric element 5a is connected via electrode 7a to one n-type thermoelectric element 6a of two n-type thermoelectric elements 6a adjacent to each other in third direction C, which is closer to p-type thermoelectric element 5a. P-type thermoelectric element 5a is connected via interconnection 8a to the other n-type thermoelectric element 6a of the two n-type thermoelectric elements 6a adjacent to each other in third direction C, which is not connected to p-type thermoelectric element 5a via electrode 7a A plurality of interconnections 8a are formed at a spacing therebetween along third direction C on insulating film 9. Thermoelectric conversion elements 3a forming the first thermoelectric conversion element group are electrically connected in series. P-type thermoelectric element 5a and n-type thermoelectric element 6a respectively have a first lateral surface 5E and a second lateral surface 6E located between one end thereof connected to electrode 7a and the other end thereof connected to interconnection 8a First lateral surface 5k and second lateral surface 6k are inclined to the first main surface. First lateral surface 5k and second lateral surface 6k are formed so as to form an obtuse angle with the one end and to form an acute angle with the other end.

With reference to FIG. 4, the first thermoelectric conversion element groups formed of thermoelectric conversion elements 3a arranged side by side along third direction C are connected via interconnections 8c in first direction A. Interconnection 8c electrically connects two thermoelectric conversion elements 3a adjacent to each other in first direction A in series. Specifically, interconnection 8c connects interconnection 8a and interconnection 8a adjacent to each other in first direction A. One interconnection 8a connected to interconnection 8c is connected only to p-type thermoelectric element 5a of one thermoelectric conversion element 3a of the two thermoelectric conversion elements 3a adjacent to each other in first direction A. The other interconnection 8a connected to interconnection 8c is connected only to n-type thermoelectric element 6a of the other thermoelectric conversion element 3a of the two thermoelectric conversion elements 3a adjacent to each other in first direction A. From a different perspective, interconnections 8a connected to interconnections 8c form one end of thermoelectric conversion elements 3a arranged side by side along third direction C and electrically connected to each other in series.

Further, a plurality of the first thermoelectric conversion element groups are formed in first direction A. The first thermoelectric conversion element groups are formed in first direction A. The first thermoelectric conversion element groups are electrically connected to each other in series via interconnections 8c Opposite ends of thermoelectric conversion elements 3 electrically connected in series are connected to electrodes for extraction interconnection 13 and 14. Interconnection 8a connected to electrode for extraction interconnection 13 is adjacent to interconnection 8a connected to interconnection 8c in third direction C and is connected only to n-type thermoelectric element 6a. Interconnection 8a connected to electrode for extraction interconnection 14 is adjacent to interconnection 8a connected to interconnection 8c in third direction C and is connected only to p-type thermoelectric element 5a Interconnections 8c and 8d and electrodes for extraction interconnection 13 and 14 are each formed on insulating film 9, similarly to interconnections 8a. Bonded to electrodes for extraction interconnection 13 and 14 are extraction interconnections (not shown) routed to the outside of thermoelectric conversion module 100.

As shown in FIG. 3, electrode 7a is formed such that a surface 7c (a surface facing a first space S1 described below) which is opposite to the surface thereof bonded to p-type thermoelectric element 5a and n-type thermoelectric element 6a is formed at a first distance L1 from the second main surface in second direction B. First distance L1 is the shortest distance between electrode 7a serving as the hot junction and the second main surface. Electrode 7a is formed such that, for example, surface 7c is orthogonal to second direction B. Electrode 7a is formed such that, for example, the distance between a terminal point G of surface 7c in third direction C and central axis O (see FIG. 2) is equal to the distance between an endpoint L of surface 7c in third direction C and central axis O. Further, electrodes 7a are formed such that, for example, the distance between endpoint G, L and central axis O (see FIG. 2) is equal to the distance between an endpoint 'I' of surface 7c of another electrode 7a in third direction C and central axis O.

As shown in FIGS. 1 to 3, projections 4 are formed on the second main surface. Projections 4 are formed so as to extend along first direction A. One end of each of projections 4 in first direction A is formed, for example, opposite to thermoelectric conversion element 3a connected to electrode for extraction interconnection 14 with respect to thermoelectric conversion element 3a connected to electrode for extraction interconnection 13 in thermoelectric conversion elements 3. The other end of each of projections 4 in first direction A is formed, for example, opposite to thermoelectric conversion element 3a connected to electrode for extraction interconnection 13 with respect to thermoelectric conversion element 3a connected to electrode for extraction interconnection 14 in thermoelectric conversion elements 3. Projections 4 are formed at a spacing therebetween in third direction C. Projections 4 each have a bottom portion connected to the second main surface and a top portion located at a side closer to the first main surface with respect to the bottom portion. Projections 4 are provided, for example, to be linearly symmetrical with respect to a line segment connecting the top portion and central axis O. Projections 4 have, for example, a V-shaped sectional shape perpendicular to first direction A. Projections 4 have a width in third direction C which gradually narrows toward the interior in second direction B. Projections 4 are formed such that the line segment passing through the bottom portion and the top portion of each projection 4 and extending to central axis O of inner tube 1 and outer tube 2, that is, the line segment passing through the bottom portion and the top portion of each respective projection 4 and extending along second direction B does not overlap electrode 7.

As shown in FIG. 2, a first projection 41 and a second projection 42 of projections 4, which are adjacent to each other in third direction C, are formed such that a first line segment D passing through the bottom portion and the top portion of first projection 41 and extending to central axis O and a second line segment E passing through the bottom portion and the top portion of second projection 42 and extending to central axis O sandwich one electrode 7a in third direction C. From a different perspective, each electrode 7 is formed so as to be located between the line segments of two projections 4 adjacent to each other in third direction C. When thermoelectric conversion module 100 is seen from first direction A, each of the line segments of projections 4 is not formed so as to intersect with first lateral surface 5E of p-type thermoelectric element 5 and second lateral surface 6k of n-type thermoelectric element 6 of thermoelectric conversion element 3.

Projections 4 have, for example, the same shape and the same dimensions. The width of each of projections 4 in third direction C is smaller than a spacing between the bottom portions of projections 4 adjacent to each other in third direction C (the width of valley portion 11 in third direction C).

As shown in FIG. 3, a shortest distance L2 between the top portion of first projection 41 and first lateral surface 5E of p-type thermoelectric element 5a of thermoelectric conversion element 3a is smaller than first distance L1. A shortest distance L4 between the top portion of second projection 42 and second lateral surface 6k of n-type thermoelectric element 6a of thermoelectric conversion element 3a is smaller than distance L1 Prom a different perspective, the distance in second direction B between the top portion of first projection 41 and first lateral surface 5E of p-type thermoelectric element 5a of thermoelectric conversion element 3a, that is, the distance on first line segment D between the top portion of first projection 41 and first lateral surface 5E of p-type thermoelectric element 5a of thermoelectric conversion element 3a is smaller than distance L1 The distance in second direction B between the top portion of second projection 42 and second lateral surface 6k of n-type thermoelectric element 6b of thermoelectric conversion element 3b, that is, the distance on second line segment k between the top portion of first projection 42 and second lateral surface 6E of n-type thermoelectric element 6a of thermoelectric conversion element 3a is smaller than distance L1. Distance L2 and distance L4 are, for example, smaller than distance L1. A length L10 of each of projections 4 in second direction B, that is, distance L10 from valley portion 11 to the top portion of projection 4 is greater than distance L1 The sum of distance L2 and distance L4 is preferably smaller than distance L1.

As shown in FIGS. 2 and 3, first to third spaces are mainly defined around one thermoelectric conversion element 3a by first projection 41 and second projection 42. All of first space S1, a second space S2, and a third space S3 extend in first direction A.

As shown in FIGS. 2 and 3, first space S1 is located between first line segment D of first projection 41 and second line segment E of second projection 42 when thermoelectric conversion module 100 is seen from first direction A. First space S1 is also located within distance L1 from the second main surface in second direction B. In other words, first space S1 is a space located at a side closer to the outer circumference with respect to electrode 7a in second direction B and is also a space located outside a circle passing through endpoints G and 1, of surface 7c of electrode 7a about central axis O. The arc of the circle has an intersection II with first projection 41 and an intersection M with second projection 42. First space S1 is thus sandwiched between first projection 41 and second projection 42 in third direction C. One electrode 7a faces one first space S1.

As shown in FIGS. 2 and 3, second space S2 is arranged in a region that faces the first lateral surface of one of thermoelectric conversion elements 3a adjacent to each other in third direction C so as to sandwich first line segment D and the second lateral surface of the other thermoelectric conversion elements 3a and is away from the second main surface by more than first distance L1 in second direction 13, when thermoelectric conversion module 100 is seen from first direction A. Second space S2 also faces the top portion of first projection 41. Second space S2 is composed of a space located inside a circle passing through an end G of surface 7c of electrode 7a of the one thermoelectric conversion element 3a which is located at the side closer to first lateral surface 5E about central axis O, and a space located inside a circle passing through an end 1 of surface 7c of electrode 7a of the other thermoelectric conversion element 3a which is located at the side closer to second lateral surface 6E about central axis O.

As shown in FIGS. 2 and 3, third space S3 is formed in a region that faces the first lateral surface of one of thermoelectric conversion elements 3a adjacent to each other in third direction C so as to sandwich second line segment E and the second lateral surface of the other thermoelectric conversion element 3a and is away from the second main surface by more than first distance L1 in second direction B, when thermoelectric conversion module 100 is seen from first direction A. Third space S3 also faces the top portion of second projection 42. Third space S3 is composed of a space located inside a circle passing through an end L of surface 7c of electrode 7a of the one thermoelectric conversion element 3a which is located at the side closer to second lateral surface 6h about central axis O. and a space located inside a circle passing through an end T of surface 7c of electrode 7a of the other thermoelectric conversion element 3a which is located at the side closer to first lateral surface 5E about central axis O.

First space S1 has a sectional area perpendicular to first direction A which is larger than those of second space S2 and third space S3. With a larger sectional area perpendicular to first direction A of each space, a fluid circulating along first direction A experiences a smaller resistance when circulating through each space. In thermoelectric conversion module 100, the resistance that the fluid experiences when circulating through first space S1 is thus smaller than the resistance that the fluid experiences when circulating through second space S2 or third space S3. This causes the main flow of the fluid circulating between inner tube 1 and outer tube 2 to circulate through first space S1, not through second space S2 or third space S3. A sufficiently large temperature difference is thus produced between electrode 7 facing first space S1 and interconnection 8 not facing first space S1, so that thermoelectric conversion element 3 has high thermoelectric efficiency.

It suffices that projections 4 have any configuration as long as they have the above configuration. Projections 4 are composed of, for example, projected portions formed of plate portion 10 bent and fan-shaped plate members that close the V-shaped end surfaces of the projected portions. Inside projections 4, a space isolated from a flow path for the heating medium which is formed between inner tube 1 and outer tube 2 is defined. The portions of projections 4 except for projected portions are connected and fixed to the inner circumferential surface of outer tube 2 in plate portion 10.

A material for inner tube 1 may be any material having a resistance to a cooling medium and is, for example, metal such as copper or aluminum. A material for outer tube 2 may be any material having a resistance to a heating medium and is, for example, copper or aluminum. A material for projection 4 is, for example, a metal material such as spring steel or stainless steel. A material for p-type thermoelectric element 5 may be any p-type semiconductor material. A material for n-type thermoelectric element 6 may be any n-type semiconductor material. The material for p-type thermoelectric element 5 and the material for n-type thermoelectric element 6 are, for example, thermoelectric semiconductors such as Bi—Te, Pb—Te, $Mg_2Si$, or MnSi. Materials for electrode 7 and interconnection 8 may be any conductive materials and are, for example, metal such as Cu, Zn, Au, Ag, or Ni. If the respective materials for p-type thermoelectric element 5, n-type thermoelectric element 6, electrode 7, and interconnection 8 have no resistance to a heating medium, a coating film made of a material having a resistance to a heating medium may be formed on their surfaces. This coating film may be, for example, coated with glass.

Function and Effect of Thermoelectric Conversion Module

Thermoelectric conversion module 100 according to Embodiment 1 includes inner tube 1 (first frame body), outer tube 2 (second frame body), thermoelectric conversion elements 3 formed on the first main surface of inner tube 1, and projections 4 formed on the second main surface of outer tube 2. Thermoelectric conversion element 3 includes interconnection 8 (cold junction) formed on the first main surface electrode 7 (hot junction) located at the side closer to the second main surface with respect to interconnection 8 and formed at distance L1 from the second main surface in second direction B, and the first lateral surface and the second lateral surface that are located between electrode 7 and interconnection 8. The first lateral surface is formed opposite to the second lateral surface in third direction C. Projections 4 include first projection 41 and second projection 42 formed at a spacing therebetween in third direction C when thermoelectric conversion module 100 is seen from first direction A. First projection 41 and second projection 42 each have the bottom portion connected to the second main surface and the top portion located at the side closer to the first main surface with respect to the bottom portion. Electrode 7 is formed so as to be located between first line segment D passing through the bottom portion and the top portion of first projection 41 and extending along second direction B and second line segment E passing through the bottom portion and the top portion of second projection 42 and extending along second direction B, when thermoelectric conversion module 100 is seen from first direction A. Shortest distance L2 between the first lateral surface and the top portion of first projection 41 and shortest distance L4 between the second lateral surface and the top portion of second projection 42 are smaller than distance L1 between electrode 7 and the second main surface.

Distance L1 and shortest distances L2 and L4 may have a correlation with sectional areas of first space S1 and second space S2 which are perpendicular to first direction A. In thermoelectric conversion module 100, accordingly, distance L1 is greater than shortest distances L2 and L4, allowing first space S1 to have a sectional area perpendicular to first direction A which is greater than that of each of second space S2 and third space S3.

The resistance that the fluid experiences when circulating through first space S1 is thus regulated to be smaller than the resistance that the fluid experiences when circulating through second space S2. This causes the main flow of the fluid circulating between inner tube 1 and outer tube 2 to circulate through first space S1, not through second space S2 As a result a sufficiently large temperature difference is produced between electrode 7 facing first space S1 and interconnection 8 not facing first space S1. Thermoelectric conversion module 100 thus generates more electricity than a conventional thermoelectric conversion module in which no projections 4 are formed.

In thermoelectric conversion module 100, thermoelectric conversion elements 3 are arranged side by side along the circumferential direction (third direction C) of inner tube 1 and outer tube 2. In this case, the heating medium circulating along first direction A is distributed isotropically in third direction C, thus reducing variations in the temperature difference produced in thermoelectric conversion elements 3. Thermoelectric conversion module 100 has a relatively small temperature difference as described above and is less likely to include a portion that generates less electricity, and thus, can generate electricity efficiently also when thermoelectric conversion elements 3 are electrically connected in series.

Projections 4 have a V-shaped sectional shape which is perpendicular to first direction A. Projections 4 can thus be formed easily by, for example, press-molding plate portion 10.

Since the first lateral surfaces and the second lateral surfaces of p-type thermoelectric element 5a and n-type thermoelectric element 6a are inclined so as to form an acute angle to the first main surface of inner tube 1, the distance between electrodes 7a and 7a adjacent to each other in third direction C can be made greater than in the case where the first lateral surfaces and the second lateral surfaces of p-type thermoelectric element 5a and n-type thermoelectric element 6a are formed perpendicular to the first main surface (Embodiment 3, which will be described below). The method of manufacturing thermoelectric conversion module 100 (described below in detail) can thus relax the accuracy in processing of projections 4, which is required in the step (S20), and the accuracy in positioning of inner tube 1 and outer tube 2 with respect to each other, which is required in the step (S30).

The other ends of p-type thermoelectric element 5 and n-type thermoelectric element 6 which are connected to interconnection 8 have been machined in accordance with the shape of interconnection 8. Thermoelectric conversion module 100 thus provides highly intimate bonding of p-type thermoelectric element 5 and n-type thermoelectric element 6 to interconnection 8 and has high reliability.

Thermoelectric conversion elements 3 formed on the outer circumferential surface of inner tube 1 are covered with the coating film. This prevents or reduces the deterioration of thermoelectric conversion elements 3 caused by a heating medium, and accordingly, thermoelectric conversion module 100 is highly durable.

Thermoelectric conversion element 3 is not connected to outer tube 2. This allows a stress caused in thermoelectric conversion element 3 to be released easily compared with the case where thermoelectric conversion element 3 is connected to outer tube 2. For example, when a temperature di(Terence is provided to thermoelectric conversion element 3, a stress is produced in thermoelectric conversion element 3 due to a difference in the coefficient of linear expansion of materials for thermoelectric conversion element 3. In particular, in thermoelectric conversion module 100 having the above configuration, a temperature difference between electrode 7 and interconnection 8 of thermoelectric conversion element 3 increases, which may produce a large stress in thermoelectric conversion element 3. In contrast, since thermoelectric conversion element 3 is not connected to outer tube 2, such a stress can be released. Thermoelectric conversion module 100 thus has high reliability against thermal stress.

A longer distance L10 is preferred. The second space can be narrowed as distance L10 is increased.

The sum of shortest distance L2 between first lateral surface 5E and the top portion of first projection 41 and shortest distance L4 between second lateral surface 6E and the top portion of second projection 42 is preferably smaller than distance L1 between electrode 7 (hot junction) and the second main surface. With this configuration, the sectional area of first space S1 perpendicular to first direction A is much larger than the sectional area of second space S2 perpendicular to first direction A than in the case where each of distance L2 and distance L4 is smaller than distance L1 but the sum of distance L2 and distance L4 is greater than distance L1. This can produce a sufficiently large temperature difference between electrode 7 facing first space S1 and interconnection 8 not facing first space S1.

Method of Manufacturing Thermoelectric Conversion Module

A method of manufacturing the thermoelectric conversion module according to Embodiment 1 will now be described with reference to FIGS. 5 to 10. The method of manufacturing the thermoelectric conversion module according to Embodiment 1 includes a step (S10) of preparing inner tube 1 (first frame body) including thermoelectric conversion elements 3 formed thereon, a step (S20) of preparing outer tube 2 (second frame body) including projections 4 formed thereon, and a step (S30) of fixing inner tube 1 and outer tube 2 with respect to each other.

In the step (S10), inner tube 1 is first prepared. The axial direction of inner tube 1 extends along first direction A, and the circumferential direction thereof extends along third direction C. Insulating film 9 is subsequently formed so as to cover the outer circumferential surface of inner tube 1. Interconnections 8 (interconnection 8a, 8c) and electrodes for extraction interconnection 13 and 14 are subsequently formed on insulating film 9. Specifically, interconnections 8 and electrodes for extraction interconnection 13 and 14 are formed by, for example, forming a conductive film so as to cover insulating film 9 and then patterning the conductive film by any approach. Interconnections 8a are formed at a spacing therebetween along third direction C. Interconnections 8c are formed at a spacing therebetween along third direction C. Interconnections 8a and interconnections 8c are formed at a spacing therebetween along first direction A.

Figure 6:
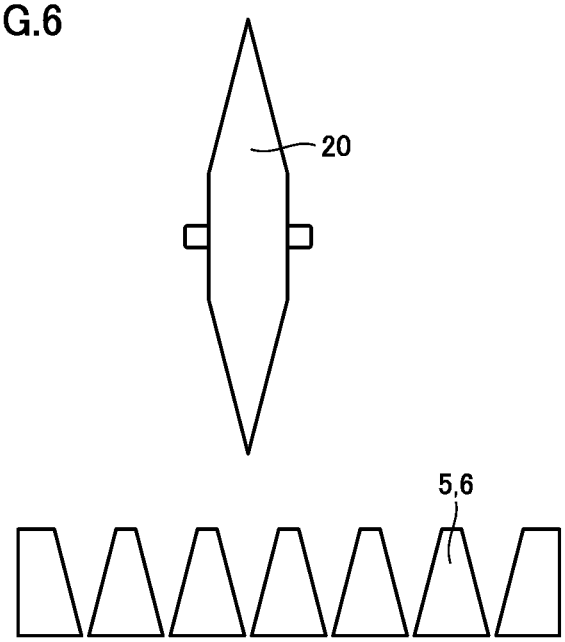
FIG. 6 shows the method of manufacturing the thermoelectric conversion module according to Embodiment 1.
Figure 7:
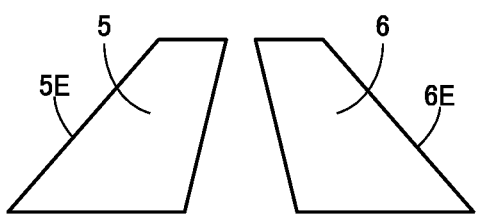
FIG. 7 shows the method of manufacturing the thermoelectric conversion module according to Embodiment 1.

Thermoelectric conversion elements 3 are subsequently formed on inner tube 1. Specifically, as shown in FIG. 6, a plate-shaped p-type thermoelectric semiconductor material and a plate-shaped n-type thermoelectric semiconductor material are cut with a blade 20. Blade 20 has, for example, a V-shaped blade surface. Consequently, a plurality of p-type thermoelectric semiconductor material pieces and a plurality of n-type thermoelectric semiconductor material pieces that have a trapezoidal sectional shape are formed. The cut surfaces of the p-type thermoelectric semiconductor material pieces and the n-type thermoelectric semiconductor material pieces are inclined to the surfaces of these materials that are not cut. As shown in FIG. 7, subsequently, the end surfaces of the p-type thermoelectric semiconductor material pieces and the n-type thermoelectric semiconductor material pieces are, for example, machined. This machining forms the one end of p-type thermoelectric element 5a and the one end of n-type thermoelectric element 6a that are connected to electrode 7 and the other ends of these elements that are connected to interconnection 8. P-type thermoelectric elements 5a and n-type thermoelectric elements 6a are formed in this manner. One end of each of p-type thermoelectric elements 5a and one end of each of n-type thermoelectric elements 6a are subsequently connected to each other by electrode 7a.

The other ends of p-type thermoelectric element 5a and n-type thermoelectric element 6a connected via electrode 7a are each connected to interconnection 8a formed on insulating film 9 of inner tube 1. The approach for this connection is, for example, brazing. Inner tube 1 is prepared in this manner, in which thermoelectric conversion elements 3 each formed of p-type thermoelectric element 5, n-type thermoelectric element 6, electrode 7, and interconnection 8 are formed on the outer circumferential surface (first main surface) of insulating film 9.

In this preparation, electrode 7 is formed at a spacing from interconnection 8 in second direction B. For example, electrode 7a is formed at a spacing (second distance) from interconnection 8 in second direction B. The first lateral surface and the second lateral surface are formed between electrode 7 and interconnection 8.

The extraction interconnections (not shown) are subsequently bonded to electrodes for extraction interconnection 13 and 14. In this step (S10), further, a coating film (not shown) is formed on the respective members formed on the outer circumferential surface of inner tube 1 alter the bonding of the extraction interconnections. The coating film is made of any material having a resistance to a heating medium circulating through first space S1 or any other space defined between the outer circumferential surface of inner tube 1 and the inner circumferential surface of outer tube 2. The coating film is formed by, for example, immersing the outer circumferential surface side of inner tube 1 in a cistern of glass coating agent with the inner circumferential surface side of inner tube 1 being protected, followed by drying.

Figure 8:
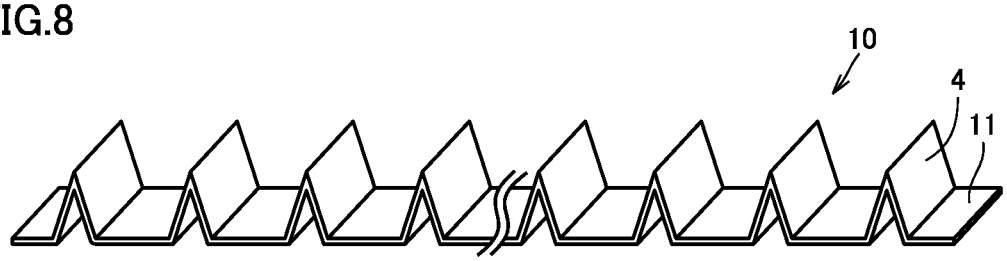
FIG. 8 shows the method of manufacturing the thermoelectric conversion module according to Embodiment 1.
Figure 9:
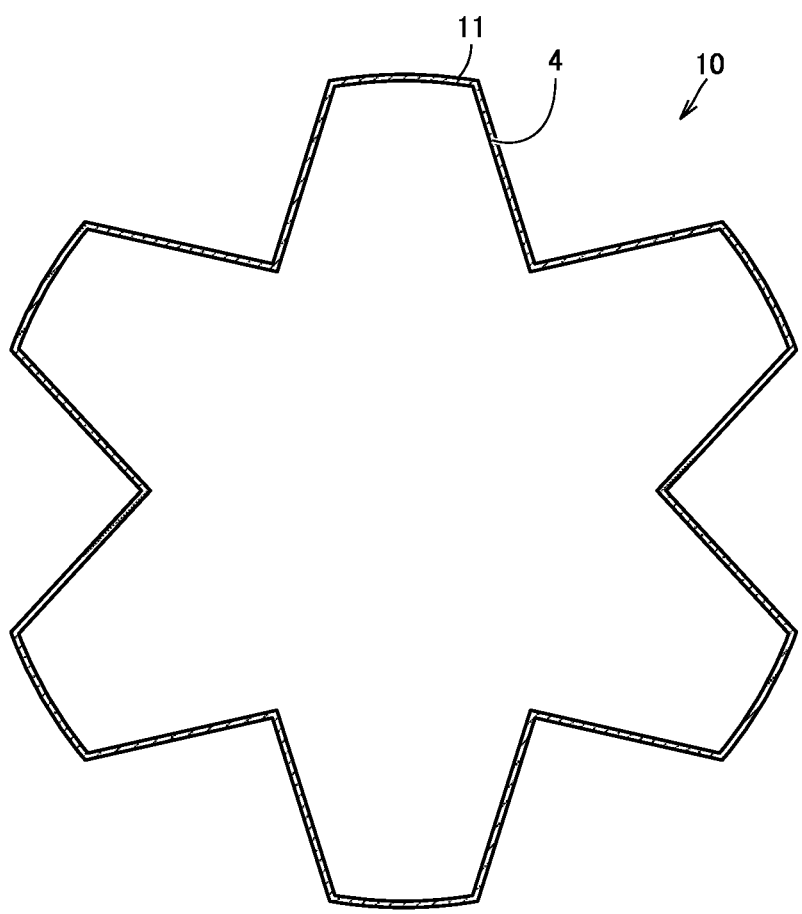
FIG. 9 shows the method of manufacturing the thermoelectric conversion module according to Embodiment 1.
Figure 10:
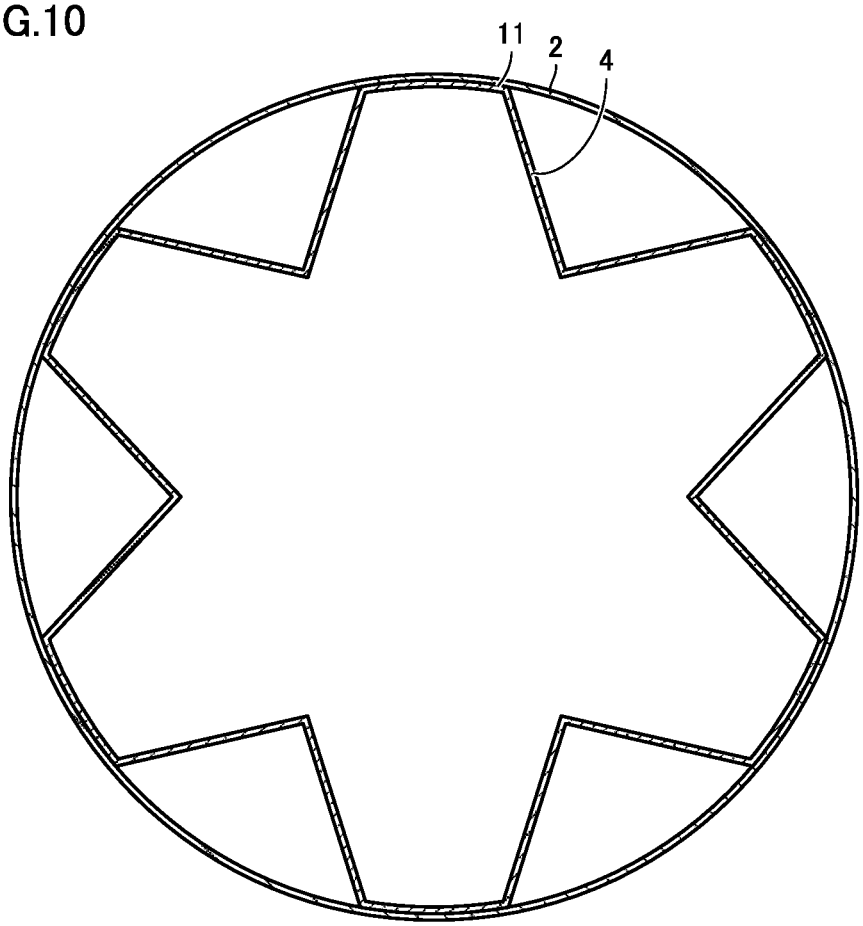
FIG. 10 show's the method of manufacturing the thermoelectric conversion module according to Embodiment 1.

In the step (S20), outer tube 2 and plate portion 10 are first prepared. Plate portion 10 has been formed into a plate. As shown in FIG. 8, plate portion 10 is subsequently bent. In this bending, plate portion 10 is bent along a plurality of mountain fold lines and a plurality of valley fold lines. The mountain told lines and the valley fold lines are each formed to extend along one direction. The mountain fold line is sandwiched between two valley fold lines. This leads to the formation of projections 4 with the mountain fold lines as their ridgelines, and valley portions 11 sandwiched between valley fold lines adjacent to each other in the direction perpendicular to the one direction. Projections 4 and valley portions 11 are formed alternately in the direction perpendicular to the one direction. As shown in FIG. 9, plate portion 10 is subsequently bent into a ring. In this bending, plate portion 10 is bent such that the vertices (ridgelines) of projections 4 face inwardly and the ridgelines extend along the axial direction, that is, the projections are arranged side by side in the circumferential direction. The V-shaped end surfaces of projections 4 are subsequently closed by fan-shaped plate members. As shown in FIG. 10, subsequently, valley portions 11 of plate portion 10 are connected and fixed to the inner circumferential surface of outer tube 2. Consequently, outer tube 2 is prepared, in which projections 4 are formed on the inner circumferential surfaces (second main surface) of valley portions 11.

In the step (S30), inner tube 1 and outer tube 2 are positioned such that electrode 7a is located between first line segment D and second line segment E when thermoelectric conversion module 100 is seen from first direction A. In other words, inner tube 1 and outer tube 2 are positioned such that electrode 7b is located between second line segment E and third line segment E Moreover, inner tube 1 and outer tube 2 are positioned such that distances L2 and L4 are smaller than distance L1 Consequently, thermoelectric conversion module 100 according to Embodiment 1 is manufactured.

In each of thermoelectric conversion elements 3a, p-type thermoelectric element 5a may be formed on one plane of two planes of the first main surface which are adjacent to each other in third direction C, and n-type thermoelectric element 6a may be formed on the other plane.

Embodiment 2

Configuration of Thermoelectric Conversion Module

A thermoelectric conversion module 101 according to embodiment 2 will be described with reference to FIGS. 11 to 16. Thermoelectric conversion module 101 provides thermoelectric elements with a temperature difference produced between a heating medium and a cooling medium circulating along first direction A and extracts a resultant thermoelectromotive force generated in the thermoelectric elements FIGS. 12, 13, 15, and 16 show cross-sections of thermoelectric conversion module 101 perpendicular to first direction A FIG. 14 is a lateral view of thermoelectric conversion module 101.

Thermoelectric conversion module 101 mainly includes inner tube 1 serving as a first frame body, outer tube 2 serving as a second frame body, thermoelectric conversion elements 3, and projections 4. One thermoelectric conversion element 3 is a so-called π-type thermoelectric conversion element and includes p-type thermoelectric element 5, n-type thermoelectric element 6, electrode 7, and interconnection 8. In Embodiment 1, the axial direction of inner tube 1 and outer tube 2 is first direction A. The radial direction of inner tube 1 and outer tube 2 is second direction B (see FIG. 13). The circumferential direction of inner tube 1 and outer tube 2 is third direction C.

Inner tube 1 is housed in outer tube 2. Inner tube 1 and outer tube 2 are formed such that, for example, their central axes O (see FIG. 12) coincide with each other. The outer circumferential surface of inner tube 1 and the inner circumferential surface of outer tube 2 face each other in second direction B. The heating medium is circulated through a space defined between the outer circumferential surface of inner tube 1 and the inner circumferential surface of outer tube 2. The cooling medium is circulated through a space inside inner tube 1. Although inner tube 1 and outer tube 2 may have any sectional shapes perpendicular to first direction A, for example, inner tube 1 has a hexagonal sectional shape and outer tube 2 has a circular sectional shape. The outer circumferential surface of inner tube 1 is covered with insulating film 9. Plate portion 10 is fixed to the inner circumferential surface of outer tube 2. A partial portion of plate portion 10 projects more than the remaining portion thereof, and the remaining portion is fixed to the inner circumferential surface of outer tube 2. That is to say, plate portion 10 has projections 4, namely the partial portion above, and valley portions 11, namely the remaining portion above (described below in detail). Herein, the surface of insulating film 9 which covers the outer circumferential surface of inner tube 1 is referred to as a first main surface. The inner circumferential surfaces of valley portions 11 of plate portion 10 fixed to the inner circumferential surface of outer tube 2 are referred to as a second main surface. When the sectional shape of inner tube 1 is a hexagonal shape, first main surface has six planes.

As shown in FIGS. 11 to 16, thermoelectric conversion elements 3 are formed on the first main surface. Thermoelectric conversion elements 3 are formed, for example, at regular intervals in first direction A and third direction C. Thermoelectric conversion elements 3 include a plurality of thermoelectric conversion elements 3a and 3b formed at a spacing therebetween along third direction C. In other words, thermoelectric conversion elements 3 include a first thermoelectric conversion element group formed of thermoelectric conversion elements 3a formed side by side at a spacing therebetween along third direction C and a second thermoelectric conversion element group formed of thermoelectric conversion elements 3b formed side by side at a spacing therebetween along third direction C. The number of thermoelectric conversion elements 3a forming the first thermoelectric conversion element group and the number of thermoelectric conversion elements 3b forming the second thermoelectric conversion element group are equal to, for example the number of vertices of the sectional shape of inner tube 1 perpendicular to first direction A.

Figure 11:
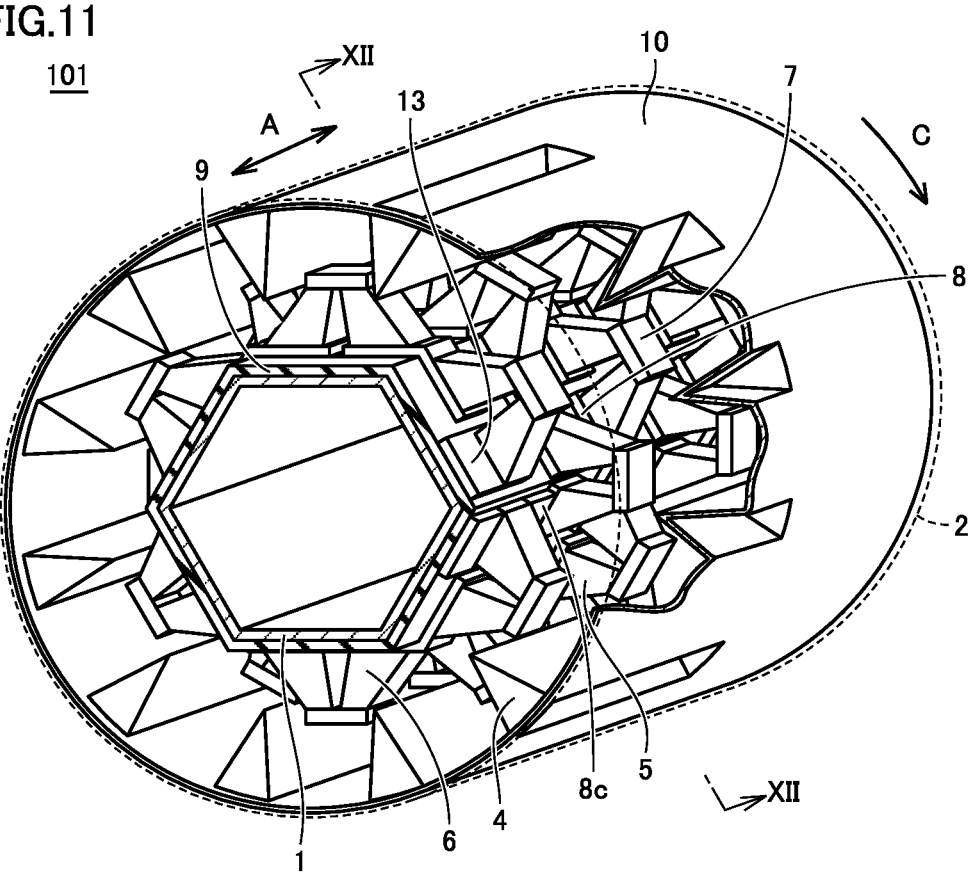
FIG. 11 is a perspective view of a thermoelectric conversion module according to Embodiment 2.

As shown in FIGS. 11 and 14, a plurality of the first thermoelectric conversion element groups, each of which is formed of thermoelectric conversion elements 3a arranged side by side along third direction C, and a plurality of the second thermoelectric conversion element groups, each of which is formed of thermoelectric conversion elements 3b arranged side by side along third direction C, are formed in first direction A. The first thermoelectric conversion element groups and the second thermoelectric conversion element groups are formed alternately at a spacing therebetween in first direction A. In FIG. 14, for the convenience of description, p-type thermoelectric elements 5 and n-type thermoelectric elements 6 are hatched by different dots, and interconnections 8 are hatched by lines.

As shown in FIGS. 13 to 16, thermoelectric conversion elements 3a forming the first thermoelectric conversion element group have a similar configuration. Thermoelectric conversion elements 3b forming the second thermoelectric conversion element group have a similar configuration. In other words, thermoelectric conversion elements 3 are formed to be rotationally symmetrical about central axis O. Thermoelectric conversion element 3a and thermoelectric conversion element 3b basically have a similar configuration.

As shown in FIGS. 13 to 16, thermoelectric conversion element 3a includes p-type thermoelectric element 5a, n-type thermoelectric element 6a, electrode 7a, and interconnection 8a. A plurality of p-type thermoelectric elements 5a and a plurality of n-type thermoelectric elements 6a are formed in third direction C P-type thermoelectric elements 5a and n-type thermoelectric elements 6a are alternately arranged in third direction C. P-type thermoelectric element 5a is connected via electrode 7a to one n-type thermoelectric element 6a of two n-type thermoelectric elements 6a adjacent to each other in third direction C, which is closer to p-type thermoelectric element 5a. P-type thermoelectric element 5a is connected via interconnection 8a to the other n-type thermoelectric element 6a of the two n-type thermoelectric elements 6a adjacent to each other in third direction C which is not connected to p-type thermoelectric element 5a via electrode 7a A plurality of interconnections 8a are formed at a spacing therebetween on insulating film 9 along third direction C. Thermoelectric conversion elements 3a forming the first thermoelectric conversion element group are electrically connected in series. P-type thermoelectric element 5a and n-type thermoelectric element 6a respectively have first lateral surface 5E and second lateral surface 6E located between one end thereof connected to electrode 7a and the other end thereof connected to interconnection 8a First lateral surface 5E and second lateral surface 6E are inclined to the first main surface. First lateral surface 5E and second lateral surface 6E are formed to form an obtuse angle with the one end and form an acute angle with the other end.

As shown in FIGS. 13 to 16, thermoelectric conversion element 3b includes a p-type thermoelectric element 5b, an n-type thermoelectric element 6b, an electrode 7b, and an interconnection 8b A plurality of p-type thermoelectric elements 5b and a plurality of n-type thermoelectric elements 6b are formed in third direction C P-type thermoelectric elements 5b and n-type thermoelectric elements 6b are arranged alternately in third direction C. P-type thermoelectric element 5b is connected via electrode 7b to one n-type thermoelectric element 6b of two n-type thermoelectric elements 6b adjacent to each other in third direction C, which is located closer to p-type thermoelectric element 5b P-type thermoelectric element 5b is connected via interconnection 8b to the other n-type thermoelectric element 6b of the two n-type thermoelectric elements 6b adjacent to each other in third direction C, which is not connected to p-type thermoelectric element 5b via electrode 7b A plurality of interconnections 8b are formed at a spacing therebetween on insulating film 9 along third direction C. Thermoelectric conversion elements 3b forming the second thermoelectric conversion element group are electrically connected in series. P-type thermoelectric element 5b and n-type thermoelectric element 6b respectively have first lateral surface 5E and second lateral surface 6E located between one end thereof connected to electrode 7b and the other end thereof connected to interconnection 8b. First lateral surface 5k and second lateral surface 6k are inclined to the first main surface. First lateral surface 5k and second lateral surface 6k are formed to form an obtuse angle with the one end and form an acute angle with the other end.

With reference to FIG. 14, the first thermoelectric conversion element group formed of thermoelectric conversion elements 3a arranged side by side along third direction C and the second thermoelectric conversion element group formed of thermoelectric conversion elements 3b arranged side by side along third direction C are connected to each other via interconnection 8c in first direction A. Interconnection 8c electrically connects thermoelectric conversion element 3a and thermoelectric conversion element 3b adjacent to each other in first direction A in series. Specifically, interconnection 8c connects interconnection 8a and interconnection 8b adjacent to each other in first direction A. Interconnection 8a connected to interconnection 8c is connected only to p-type thermoelectric element 5a Interconnection 8b connected to interconnection 8c is connected only to n-type thermoelectric element 6b From a different perspective, interconnections 8a connected to interconnections 8c form one end in thermoelectric conversion elements 3a arranged side by side along third direction C and electrically connected in series. Interconnections 8b connected to interconnections 8c form one end in thermoelectric conversion elements 3b arranged side by side along third direction C and electrically connected in series.

A plurality of the first thermoelectric conversion element groups and a plurality of the second thermoelectric conversion element groups are formed in first direction A. The first thermoelectric conversion element groups and the second thermoelectric conversion element groups are formed alternately in first direction A. The first thermoelectric conversion element groups and the second thermoelectric conversion element groups are electrically connected to each other in series via interconnections 8c. The opposite ends of thermoelectric conversion elements 3 electrically connected in series are connected to electrodes for extraction interconnection 13 and 14. Interconnection 8a connected to electrode for extraction interconnection 13 is adjacent to interconnection 8a connected to interconnection 8c in third direction C and is connected only to n-type thermoelectric element 6a Interconnection 8b connected to electrode for extraction interconnection 14 is adjacent to interconnection 8b connected to interconnection 8c in third direction C and is connected only to p-type thermoelectric element 5b. All of interconnections 8c and 8d and electrodes for extraction interconnection 13 and 14 are formed on insulating film 9 similarly to interconnections 8a and 8b. Bonded to electrodes for extraction interconnection 13 and 14 are extraction interconnections (not shown) routed to the outside of thermoelectric conversion module 101.

As shown in FIGS. 11 to 16, electrodes 7a and electrodes 7b are formed so as not to overlap each other when thermoelectric conversion module 101 is seen from first direction A. Electrode 7a is bonded to, for example, one end of each of p-type thermoelectric element 5a and n-type thermoelectric element 6a formed on the same plane on the first main surface. Electrode 7b is bonded to, for example, one end of each of p-type thermoelectric element 5b and n-type thermoelectric element 6b formed on two respective planes adjacent to each other on the first main surface.

Figure 12:
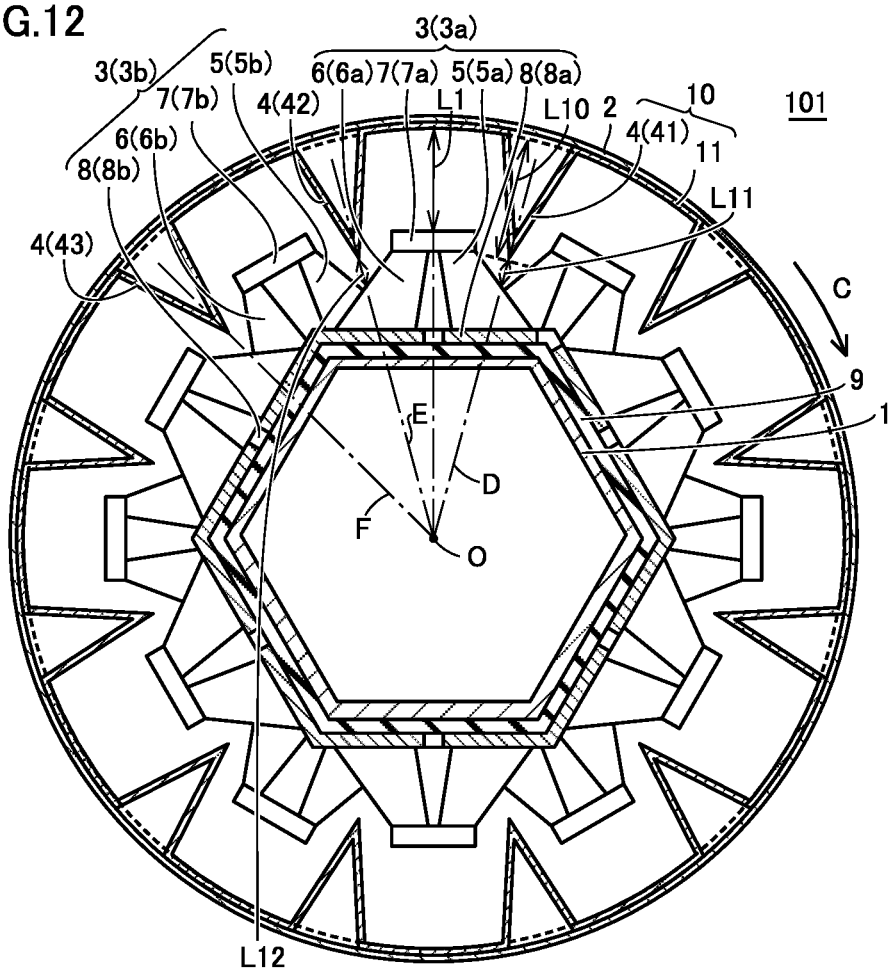
FIG. 12 is a sectional view of the thermoelectric conversion module according to Embodiment 2 which is perpendicular to the first direction.
Figure 13:
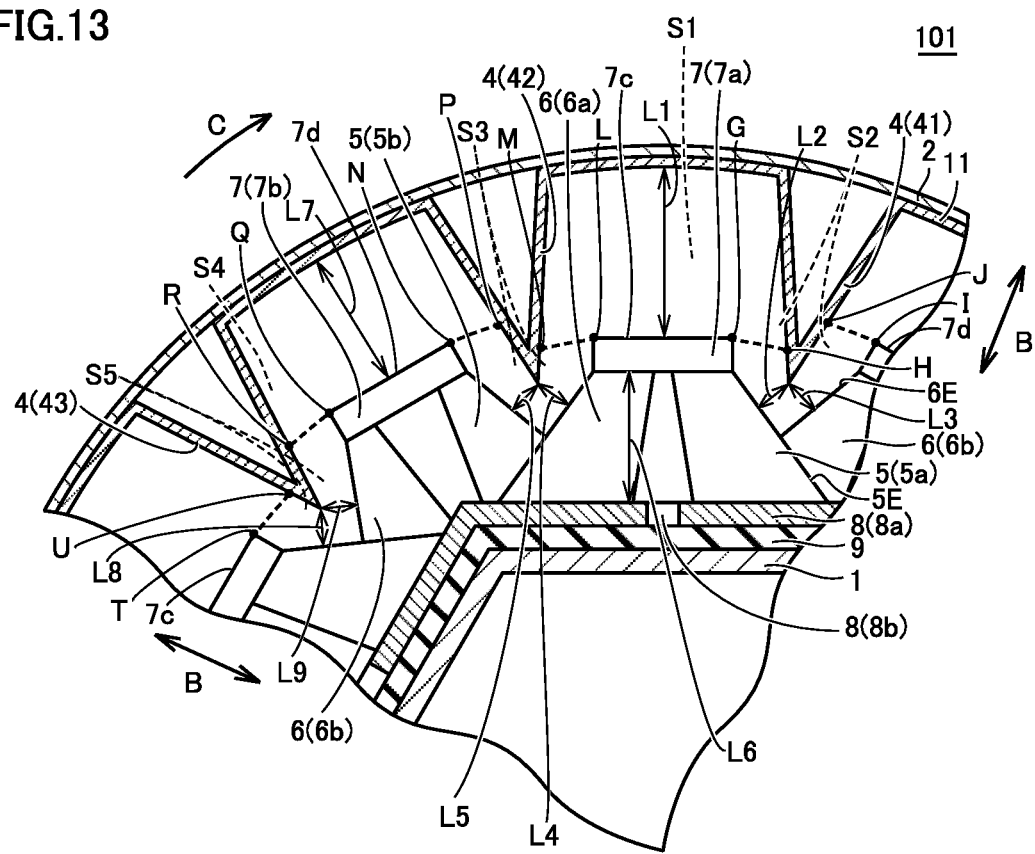
FIG. 13 is a partially enlarged view of the thermoelectric conversion module shown in FIG. 12.
Figure 14:
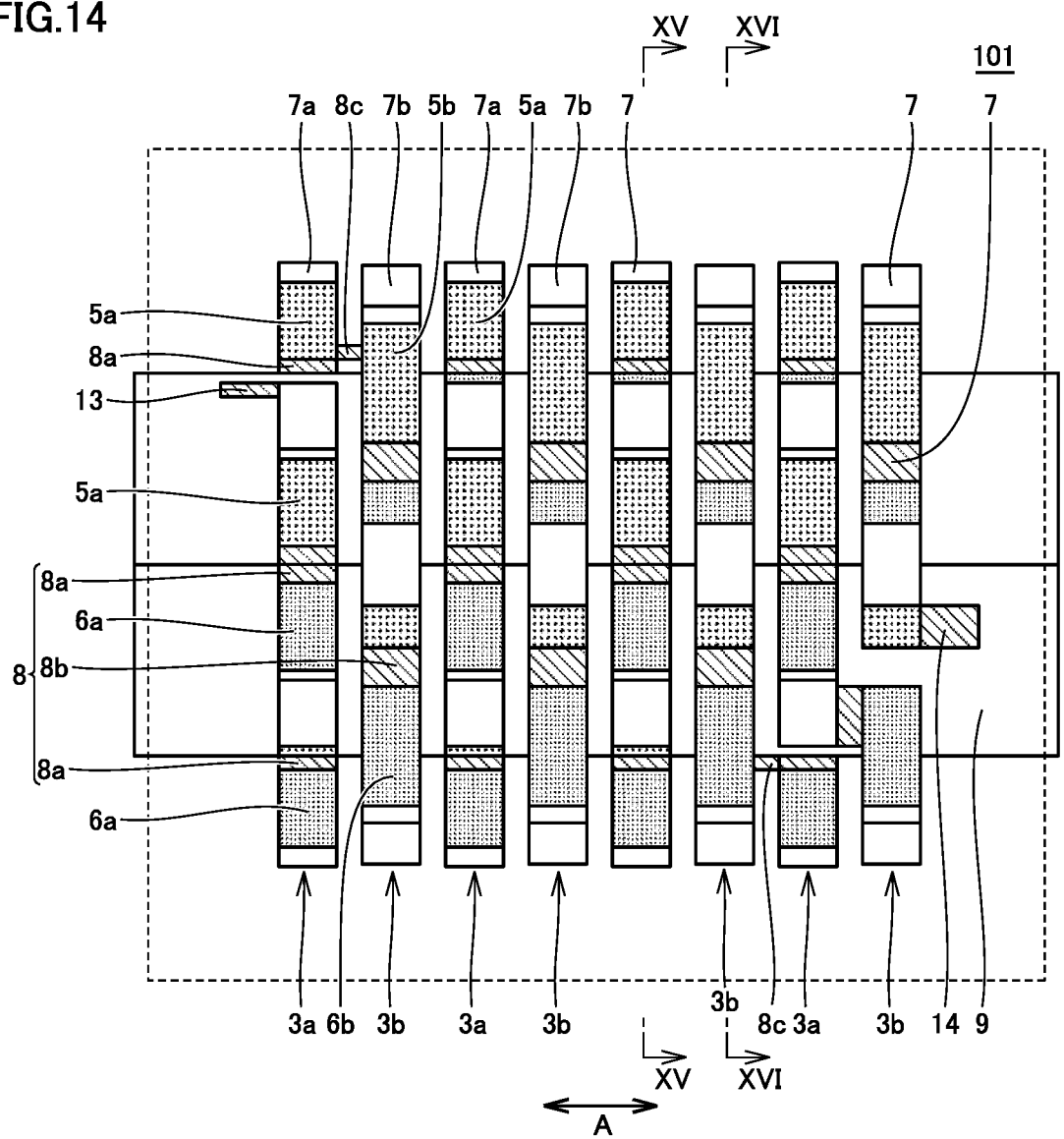
FIG. 14 is a side view of the thermoelectric conversion module according to Embodiment 2.
Figure 15:
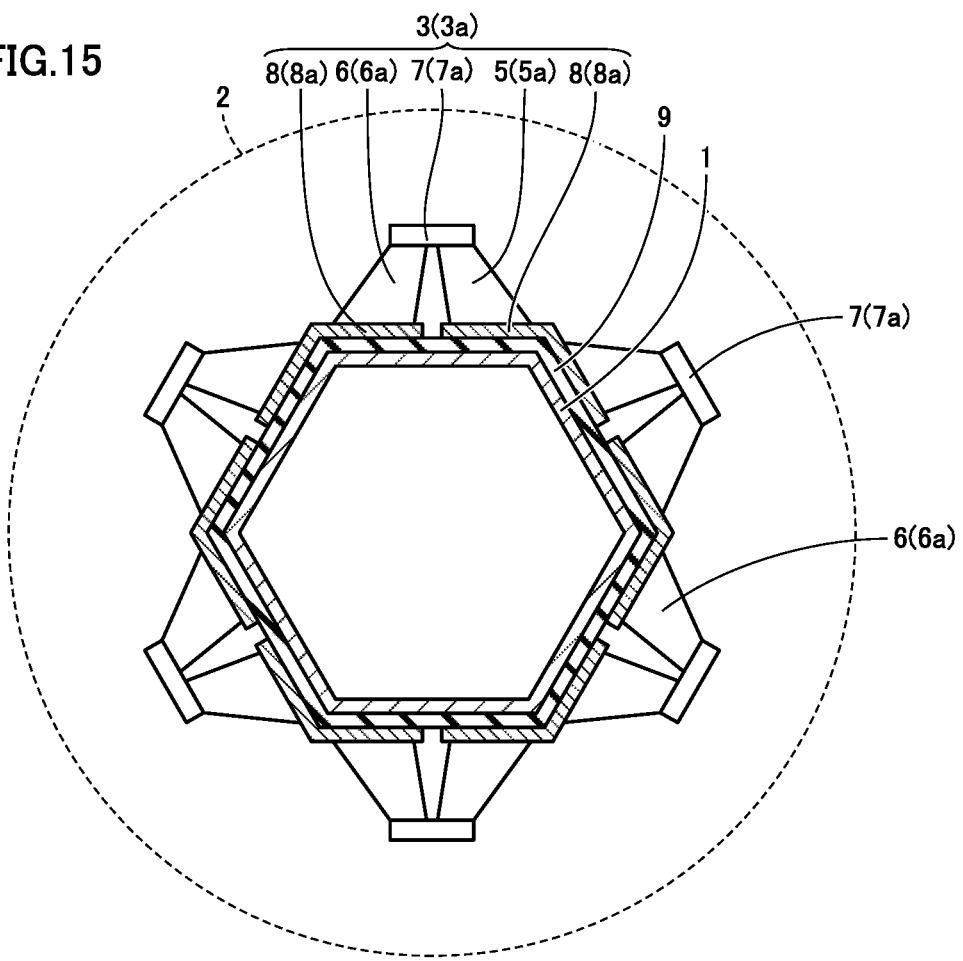
FIG. 15 is an end view seen from a line segment XV-XV in FIG. 14.
Figure 16:
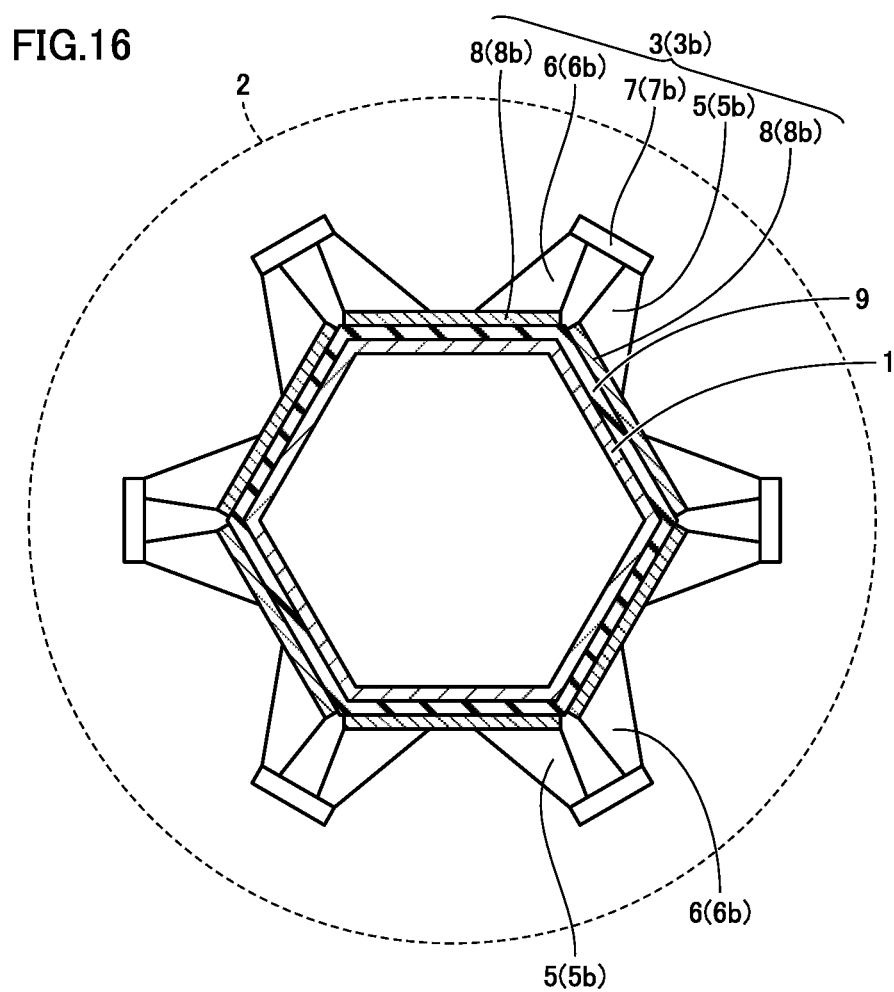
FIG. 16 is an end view seen from a line segment XVI-XVI in FIG. 14.

As shown in FIG. 13, electrode 7a is formed such that surface 7c (a surface facing first space S1 described below) opposite to the surface thereof bonded to p-type thermoelectric element 5a and n-type thermoelectric element 6a is away from the second main surface by distance L1 in second direction B. Electrode 7a is formed such that, for example, surface 7c is orthogonal to second direction B. Electrode 7a is formed such that, for example, the distance between endpoint G of surface 7c in third direction C and central axis O (sec FIG. 12) is equal to the distance between endpoint L of surface 7c in third direction C and central axis O. Further, electrodes 7a are formed such that, for example, the distance between endpoint G, L and central axis O (see FIG. 12) is equal to the distance between endpoint T of surface 7c of another electrode 7a in third direction C and central axis O.

As shown in FIG. 13, electrode 7b is formed such that surface 7d (a surface facing first space S1 described below) opposite to the surface thereof bonded to p-type thermoelectric element 5b and n-type thermoelectric element 6b is away from the second main surface by distance L7 in second direction B. Electrode 7b is formed such that, for example, surface 7d is orthogonal to second direction B. Electrode 7b is formed such that, for example, the distance between an endpoint K of surface of 7d in third direction and central axis O (see FIG. 12) is equal to the distance between an endpoint Q of surface of 7d in third direction and central axis O. Further, electrodes 7b are formed such that, for example, the distance between endpoint N, Q and central axis O (see FIG. 12) is equal to the distance between an endpoint 1 of surface 7d of another electrode 7b in third direction C and central axis O. Distance L1 (first distance) and distance L7 may be formed to be equal to each other, or one distance may be formed to be greater than the other distance.

As shown in FIGS. 11 to 13, 15, and 16, projections 4 are formed on the second main surface. Projections 4 are formed so as to extend along first direction A. One end of each of projections 4 in first direction A is formed opposite to, for example, thermoelectric conversion element 3b connected to electrode for extraction interconnection 14 with respect to thermoelectric conversion element 3a connected to electrode for extraction interconnection 13 in thermoelectric conversion elements 3. The other end of each of projections 4 in first direction A is formed opposite to, for example, thermoelectric conversion element 3a connected to electrode for extraction interconnection 13 with respect to thermoelectric conversion element 3b connected to electrode for extraction interconnection 14 in thermoelectric conversion elements 3. Projections 4 are formed at a spacing therebetween in third direction C. Projections 4 each have a bottom portion connected to the second main surface, and a top portion located at the side closer to the first main surface with respect to the bottom portion. Projections 4 are provided, for example, to be linearly symmetrical with respect to a line segment connecting the top portion and central axis O. Projections 4 have, for example, a V-shaped sectional shape perpendicular to first direction A. Projections 4 have a width in third direction C which gradually narrows toward the interior in second direction B. Projections 4 are formed such that each line segment passing through the bottom portion and the top portion of each projection 4 and extending to central axis O of inner tube 1 and outer tube 2, that is, the line segment passing through the bottom portion and the top portion of each projection 4 and extending in second direction B does not overlap electrode 7.

As shown in FIG. 12, first projection 41 and second projection 42 of projections 4 which are adjacent to each other in third direction C are formed such that first line segment D passing though the bottom portion and the top portion of first projection 41 and extending to central axis O and second line segment h passing through the bottom portion and the top portion of second projection 42 and extending to central axis O sandwich one electrode 7a in third direction C. Similarly, second projection 42 and a third projection 43 adjacent to each other in third direction C are formed such that second line segment E passing through the bottom portion and the top portion of second projection 42 and extending to central axis O and a third line segment F passing through the bottom portion and the top portion of third projection 43 and extending to central axis O sandwich one electrode 7b in third direction C. From a different perspective, each electrode 7 is formed so as to be located between the line segments of two projections 4 adjacent to each other in third direction C. When thermoelectric conversion module 101 is seen from first direction A, each line segment of projection 4 is formed so as to intersect with first lateral surface 5E of p-type thermoelectric element and second lateral surface 6E of n-type thermoelectric element 6 of thermoelectric conversion element 3. In other words, the top portions of projections 4 are formed at a spacing from thermoelectric conversion elements 3 (specifically, first lateral surface 5E of p-type thermoelectric element 5 and second lateral surface 6E of n-type thermoelectric element 6) in second direction B. This spacing may be equal or different among projections 4. For example, the top portion of first projection 41 and thermoelectric conversion element 3 are away from each other at a spacing L11 therebetween (see FIG. 12), and the top portion of second projection 42 and thermoelectric conversion element 3 are away from each other at a spacing L12 therebetween (sec FIG. 12).

Projections 4 have for example, the same shape and the same dimensions. The width of each of projections 4 in third direction C is smaller than a spacing between the bottom portions of projections 4 adjacent to each other in third direction C (the width of valley portion 11 in third direction C).

Shortest distance L2 between the top portion of first projection 41 and first lateral surface 5E of p-type thermoelectric element 5a of thermoelectric conversion element 3a is smaller than distance L1 and distance L7. Shortest distance L3 between the top portion of first projection 41 and second lateral surface GE of n-type thermoelectric element 6b of thermoelectric conversion element 3b is smaller than distance L1 and distance L7. From a different perspective, the distance in second direction B between the top portion of first projection 41 and first lateral surface 5E of p-type thermoelectric element 5a of thermoelectric conversion element 3a, that is, the distance on first line segment D between the top portion of first projection 41 and first lateral surface 5E of p-type thermoelectric element 5a of thermoelectric conversion element 3a is smaller than distance L1 The distance in second direction B between the top portion of first projection 41 and second lateral surface GE of n-type thermoelectric element 6b of thermoelectric conversion element 3b, that is, the distance on first line segment D between the top portion of first projection 41 and second lateral surface 6E of n-type thermoelectric element 6b of thermoelectric conversion element 3b is smaller than distance L1. The sum of distance L2 and distance L4 is preferably smaller than distance L1 and distance L7.

Shortest distance L4 between the top portion of second projection 42 and second lateral surface 6h of n-type thermoelectric element 6a of thermoelectric conversion element 3a is smaller than distance L1 and distance L7 Shortest distance L5 between the top portion of second projection 42 and first lateral surface 5E of p-type thermoelectric element 5b of thermoelectric conversion element 3b is smaller than distance L1 and distance L7. From a different perspective, the distance in second direction B between the top portion of second projection 42 and second lateral surface 6E of n-type thermoelectric element 6a of thermoelectric conversion element 3a, that is, the distance on second line segment E between the top portion of second projection 42 and second lateral surface GE of n-type thermoelectric element 6a of thermoelectric conversion element 3a is smaller than distance L1 The distance in second direction B between the top portion of second projection 42 and first lateral surface 5E of p-type thermoelectric element 5b of thermoelectric conversion element 3b, that is, the distance on second line segment E between the lop portion of second projection 42 and first lateral surface 5E of p-type thermoelectric element 5b of thermoelectric conversion element 3b is smaller than distance L1. The sum of distance L4 and distance L5 is preferably smaller than distance L1 and distance L7.

A shortest distance L8 between the top portion of third projection 43 and first lateral surface 5E of p-type thermoelectric element 5a of thermoelectric conversion element 3a is smaller than distance L1 and distance L7. A shortest distance L9 between the top portion of third projection 43 and second lateral surface 6E of n-type thermoelectric element 6b of thermoelectric conversion element 3b is smaller than distance L1 and distance L7. From a different perspective, the distance in second direction B between the top portion of third projection 43 and first lateral surface 5E of p-type thermoelectric element 5a of thermoelectric conversion element 3a, that is, the distance on third line segment F between the top portion of third projection 43 and first lateral surface 5E of p-type thermoelectric element 5a of thermoelectric conversion element 3a is smaller than distance L7. The distance in second direction B between the top portion of third projection 43 and second lateral surface GE of n-type thermoelectric element 6b of thermoelectric conversion element 3b, that is, the distance on third line segment F between the top portion of third projection 43 and second lateral surface 6E of n-type thermoelectric element 6b of thermoelectric conversion element 3b is smaller than distance L7. The sum of distance L8 and distance L9 is preferably smaller than distance L1 and distance L7.

Distance L11 and distance L12 are smaller than distance L1 and distance L7.

Length L10 of each of projections 4 in second direction B, that is, distance L10 from valley portion 11 to the top portion of projection 4 is greater than distance L1 and distance L7.

As shown in FIGS. 12 and 13, first to third spaces are mainly defined around one thermoelectric conversion element 3a by first projection 41 and second projection 42. All of first space S1, second space S2, and third space S3 extend in first direction A.

As shown in FIGS. 12 and 13, when thermoelectric conversion module 101 is seen from first direction A, first space S1 is located between first line segment D of first projection 41 and second line segment E of second projection 42. First space S1 is also located within distance L1 from the second main surface in second direction B. In other words, first space S1 is a space located at the side closer to the circumference with respect to electrode 7a in second direction 13 and also a space located outside a circle passing through endpoints G and L of surface 7c of electrode 7a about central axis O. The are of the circle has an intersection U with first projection 41 and an intersection M with second projection 42. First space S1 is thus sandwiched between first projection 41 and second projection 42 in third direction C. One electrode 7a faces one first space S1.

As shown in FIGS. 12 and 13, second space S2 faces first lateral surface 5k of one of thermoelectric conversion elements 3a adjacent to each other in third direction C so as to sandwich first line segment D and second lateral surface 6E of the other thermoelectric conversion element 3b when thermoelectric conversion module 101 is seen from first direction A. Second space S2 also faces the top portion of first projection 41. Second space S2 is composed of a space located inside a circle passing through end G of surface 7c of electrode 7a of thermoelectric conversion element 3a which is located at the side closer to first lateral surface 5k about central axis O. and a space located inside a circle passing through end 1 of surface 7d of electrode 7b of thermoelectric conversion element 3b which is located at the side closer to second lateral surface 6E about central axis O.

As shown in FIGS. 12 and 13, third space S3 faces second lateral surface 6E of one of thermoelectric conversion elements 3a adjacent to each other in third direction C so as to sandwich second line segment k and first lateral surface 5k of the other thermoelectric conversion element 3b when thermoelectric conversion module 101 is seen from first direction A. Third space S3 also faces the top portion of second projection 42. Third space S3 is composed of a space located inside a circle passing through an end L of surface 7c of electrode 7a of thermoelectric conversion element 3a which is located at the side closer to second lateral surface 6E about central axis O and a space located inside a circle passing through an end N of surface 7d of electrode 7b of thermoelectric conversion element 3b which is located at the side closer to first lateral surface 5k about central axis O. First space S1 is connected to second space S2 and third space S3.

Moreover, in addition to first space S1 to third space S3, a fourth space S4 and a fifth space S5 are defined around one thermoelectric conversion element 3b.

As shown in FIGS. 12 and 13, fourth space S4 is located between second line segment k of second projection 42 and third line segment F of third projection 43 when thermoelectric conversion module 101 is seen from first direction A. Fourth space S4 is also located within distance L7 from the second main surface in second direction B. In other words, fourth space S4 is a space located at the side closer to the circumference with respect to electrode 7b in second direction B and also a space located outside a circle passing through endpoints N and Q of surface 7d of electrode 7b about central axis O. The are of the circle has an intersection P with second projection 42 and an intersection R with third projection 43. Fourth space S4 is thus sandwiched between third projection 43 and second projection 42 in third direction C. One electrode 7b faces one fourth space S4.

As shown in FIGS. 12 and 13, fifth space S5 faces first lateral surface 5k of one of thermoelectric conversion elements 3a adjacent to each other in third direction C so as to sandwich third line segment F and second lateral surface 6E of the other thermoelectric conversion element 3b when thermoelectric conversion module 101 is seen from first direction A. Fifth space S5 also faces the top portion of third projection 43. Fifth space S5 is composed of a space located inside a circle passing through end Q of surface 7d of electrode 7b of thermoelectric conversion element 3b which is located at the side closer to second lateral surface 6k about central axis O and a space located inside a circle passing through end T of surface 7c of electrode 7a of thermoelectric conversion element 3a which is located at the side closer to first lateral surface 5E about central axis O. First space S1 is connected to second space S2 and third space S3.

First space S1 has a sectional area perpendicular to first direction A which is larger than that of any of second space S2 and third space S3. Further, first space S1 has a sectional area perpendicular to first direction A which is larger than that of fifth space S5. Similarly, fourth space S4 has a sectional area perpendicular to first direction A which is larger than that of any of second space S2, third space S3, and fifth space S5. With a larger sectional area of each space which is perpendicular to first direction A, a fluid circulating along first direction A experiences a smaller resistance when circulating through each space. In thermoelectric conversion module 101, the resistance that the fluid experiences when circulating through first space S1 is thus smaller than the resistances that the fluid experiences when circulating through second space S2 and third space S3. This allows the main flow of the fluid circulating between inner tube 1 and outer tube 2 to circulate through first space S1, not through second space S2 or third space S3. Consequently, a sufficiently large temperature difference is produced between electrode 7 facing first space S1 and interconnection 8 not facing first space S1, and accordingly, thermoelectric conversion element 3 has high thermoelectric efficiency.

It suffices that projections 4 have any configuration as long as they have the above configuration. Projections 4 are composed of for example, projected portions formed of plate portion 10 bent and fan-shaped plate members that close the V-shaped end surfaces of the projected portions. A space isolated from the flow path for a heating medium which is formed between inner tube 1 and outer tube 2 is defined inside projections 4. The portions of projections 4 except for projected portions are connected and fixed to the inner circumferential surface of outer tube 2 in plate portion 10.

A material for inner tube 1 may be any material having a resistance to a cooling medium and is, for example, metal such as copper or aluminum. A material for outer tube 2 may be any material having a resistance to a heating medium and is, for example, metal such as copper or aluminum. A material for projection 4 is, for example, a metal material such as spring steel or stainless steel. A material for p-type thermoelectric element 5 may be any p-type semiconductor material. A material for n-type thermoelectric element 6 may be any n-type semiconductor material. The material for p-type thermoelectric element 5 and the material for n-type thermoelectric element 6 are, for example, thermoelectric semiconductors such as Bi—Te. Pb-type, $Mg_2Si$, or MnSi. Materials for electrode 7 and interconnection 8 may be any conductive materials and are, for example, metal such as Cu, Zn, Au, Ag, or Ni. If the respective materials for p-type thermoelectric element 5, n-type thermoelectric element 6, electrode 7, and interconnection 8 have no resistance to a heating medium, a coating film made of a material having a resistance to a heating medium may be formed on their surfaces. This coating film may be, for example, coated with glass.

Method of Manufacturing Thermoelectric Conversion Module

A method of manufacturing the thermoelectric conversion module according to Embodiment 2 will now be described. The method of manufacturing the thermoelectric conversion module according to embodiment 2 basically includes steps similar to those of the method of manufacturing the thermoelectric conversion module according to Embodiment 1 The method of manufacturing the thermoelectric conversion module according to Embodiment 2 includes the step (S10) of preparing inner tube 1 (first frame body) including thermoelectric conversion elements 3 formed thereon, the step (S20) of preparing outer tube 2 (second frame body) including projections 4 formed thereon, and the step (S30) of fixing inner tube 1 and outer tube 2 to each other.

In the step (S10), inner tube 1 is first prepared. The axial direction of inner tube 1 extends along first direction A, and the circumferential direction thereof extends along third direction C. Insulating film 9 is subsequently formed so as to cover the outer circumferential surface of inner tube 1. Interconnections 8 (interconnections 8a, 8b, 8c, 8d), and electrodes for extraction interconnection 13 and 14 are subsequently formed on insulating film 9. Specifically, interconnections 8 and electrodes for extraction interconnection 13 and 14 are formed by, for example, forming a conductive film so as to cover insulating film 9 and then patterning the conductive film by any approach. Interconnections 8a are formed at a spacing therebetween along third direction C. Interconnections 8b are formed at a spacing therebetween along third direction C. Interconnections 8a and interconnections 8a are formed alternately in third direction C.

Thermoelectric conversion elements 3 are subsequently formed on inner tube 1. Specifically, as shown in FIG. 6, a plate-shaped p-type thermoelectric semiconductor material and a plate-shaped n-type thermoelectric semiconductor material are cut with a blade 20. Blade 20 has, for example, a V-shaped blade surface. This forms a plurality of p-type thermoelectric semiconductor material pieces and a plurality of n-type thermoelectric semiconductor material pieces that have a trapezoidal sectional shape. The cut surfaces of the p-type thermoelectric semiconductor material pieces and the n-type thermoelectric semiconductor material pieces are inclined to the surfaces of these materials that are not cut. As shown in FIG. 7, subsequently, the end surfaces of the p-type thermoelectric semiconductor material pieces and the n-type thermoelectric semiconductor material pieces are machined. This machining forms the one end of p-type thermoelectric element 5a and the one end of n-type thermoelectric element 6a that are connected to electrode 7 and the other ends of these elements that are connected to interconnection 8. P-type thermoelectric elements 5a and 5b and n-type thermoelectric elements 6a and 6b are formed in this manner. One end of p-type thermoelectric element 5a and one end of n-type thermoelectric element 6a are subsequently connected to each other by electrode 7a. Further, one end of p-type thermoelectric element 5b and one end of n-type thermoelectric element 6b are connected to each other by electrode 7b.

The other ends of p-type thermoelectric element 5a and n-type thermoelectric element 6a connected to each other via electrode 7a are connected to interconnection 8a formed on insulating film 9 of inner tube 1. The other ends of p-type thermoelectric element 5b and n-type thermoelectric element 6b connected to each other via electrode 7b are connected to interconnection 8b formed on insulating film 9 of inner tube 1. The approach for this connection is, for example, brazing. Inner tube 1 is prepared in this manner, in which thermoelectric conversion elements 3 each composed of p-type thermoelectric element 5, n-type thermoelectric element 6, electrode 7, and interconnection 8 are formed on the outer circumferential surface (first main surface) of insulating film 9.

In this preparation, electrode 7 is formed at a spacing from interconnection 8 in second direction B. For example, electrode 7a is formed at a spacing (second distance) from interconnection 8 in second direction B. First lateral surface 5E and second lateral surface 6h are formed between electrode 7 and interconnection 8.

The extraction interconnections (not shown) are subsequently bonded to electrodes for extraction interconnection 13 and 14. In this step (S10), further, a coating film (not shown) is formed on the respective members formed on the outer circumferential surface of inner tube 1 alter the bonding of the extraction interconnections. The coating film is made of any material having a resistance to a heating medium circulating through first space S1 or any other space defined between the outer circumferential surface of inner tube 1 and the inner circumferential surface of outer tube 2. The coating film is formed by, for example, immersing the outer circumferential surface side of inner tube 1 in a cistern of glass coating agent with the inner circumferential surface side of inner tube 1 being protected, followed by drying.

In the step (S20), outer tube 2 and plate portion 10 are first prepared. Plate portion 10 has been formed into a plate. As shown in FIG. 8, plate portion 10 is subsequently bent. In this bending, plate portion 10 is bent along a plurality of mountain fold lines and a plurality of valley fold lines. The mountain fold lines and the valley fold lines are each formed to extend along one direction. The mountain fold line is sandwiched between two valley fold lines. This forms projections 4 with the mountain fold lines as their ridgelines, and valley portions 11 sandwiched between valley fold lines adjacent to each other in the direction perpendicular to the one direction. Projections 4 and valley portions 11 are formed alternately in the direction perpendicular to the one direction. Plate portion 10 is subsequently bent into a ring. In this bending, plate portion 10 is bent such that the vertices (ridgelines) of projections 4 face inwardly and the ridgelines extend along the axial direction, that is, the projections are arranged side by side in the circumferential direction. The V-shaped end surfaces of projections 4 are subsequently closed by fan-shaped plate members. Valley portions 11 of plate portion 10 are subsequently connected and fixed to the inner circumferential surface of outer tube 2. Consequently, outer tube 2 is prepared, in which projections 4 are formed on the inner circumferential surfaces (second main surface) of valley portions 11.

In the step (S30), inner tube 1 and outer tube 2 are positioned such that electrode 7a is located between first line segment D and second line segment E when thermoelectric conversion module 101 is seen from first direction A. In other words, inner tube 1 and outer tube 2 are positioned such that electrode 7b is located between second line segment E and third line segment E Moreover, inner lube 1 and outer tube 2 are positioned such that distances L2 to L5 are smaller than distance L1. Consequently, thermoelectric conversion module 101 according to Embodiment 2 is manufactured.

Function and Effect of Thermoelectric Conversion Module

Thermoelectric conversion module 101 according to Embodiment 2 includes inner tube 1 (first frame body), outer tube 2 (second frame body), thermoelectric conversion elements 3 formed on the first main surface of inner tube 1, and projections 4 formed on the second main surface of outer tube 2. Thermoelectric conversion element 3 includes interconnection 8 (cold junction) formed on the first main surface, electrode 7 (hot junction) located at the side closer to the second main surface with respect to interconnection 8 and formed at distance L1 from the second main surface in second direction B, and first lateral surface 5E and second lateral surface 6E that are located between electrode 7 and interconnection 8. First lateral surface 5E is formed opposite to second lateral surface 6E in third direction C. Projections 4 include first projection 41 and second projection 42 formed at a spacing therebetween in third direction C when thermoelectric conversion module 101 is seen from first direction A. First projection 41 and second projection 42 each have the bottom portion connected to the second main surface and the top portion located at the side closer to the first main surface with respect to the bottom portion. Electrode 7 is formed so as to be located between first line segment D passing through the bottom portion and the top portion of first projection 41 and extending along second direction B and second line segment E passing through the bottom portion and the top portion of second projection 42 and extending along second direction B when thermoelectric conversion module 101 is seen from first direction A. Shortest distance L2 between first lateral surface 5E and the top portion of first projection 41 and shortest distance L3 between second lateral surface 6E and the top portion of second projection 42 are each smaller than distance L1 between electrode 7 and the second main surface.

Distance L1 and shortest distances L2 to L5 may have a correlation with the sectional areas of space S1, second space S2, and third space S3 which are perpendicular to first direction A. In thermoelectric conversion module 101, accordingly, the sectional area of first space S1 which is perpendicular to first direction A is larger than the sectional area of each of second space S2 and third space S3 which are perpendicular to first direction A.

The resistance that the fluid experiences when circulating through first space S1 is thus regulated to be smaller than the resistance that the fluid experiences when circulating through second space S2. This causes the main flow of the fluid circulating between inner tube 1 and outer tube 2 to circulate through first space S1, not through second space S2. This produces a sufficiently large temperature difference between electrode 7 facing first space S1 and interconnection 8 not facing first space S1. Thermoelectric conversion module 101 thus generates more electricity than a conventional thermoelectric conversion module in which no projections 4 are formed.

In thermoelectric conversion module 101 thermoelectric conversion elements 3 are arranged side by side along the circumferential direction (third direction C) of inner tube 1 and outer tube 2. In this case, a heating medium circulating along first direction A is distributed isotropically in third direction C, thus reducing variations in the temperature difference produced in thermoelectric conversion elements 3. Thermoelectric conversion module 101 has a relatively small temperature difference as described above and is less likely to include a portion that generates less electricity, and thus, can generate electricity efficiently also when thermoelectric conversion elements 3 are electrically connected in series.

Projections 4 have a V-shaped sectional shape which is perpendicular to first direction A. Projections 4 can thus be formed easily by, for example, press-molding plate portion 10.

Since the first lateral surfaces and the second lateral surfaces of p-type thermoelectric element 5a and n-type thermoelectric element 6a are inclined to the first main surface of inner tube 1 so as to form an acute angle, the distance between electrodes 7a and 7a adjacent to each other in third direction C can be made greater than in the case where the first lateral surfaces and the second lateral surfaces of p-type thermoelectric element 5a and n-type thermoelectric element 6a are formed perpendicular to the first main surface (Embodiment 3, which will be described below). The method of manufacturing thermoelectric conversion module 101 can thus relax the accuracy in processing of projections 4, which is required in the step (S20), and the accuracy in positioning of inner tube 1 and outer tube 2 with respect to each other, which is required in the step (S30).

The other ends of p-type thermoelectric element 5 and n-type thermoelectric element 6 which are connected to interconnection 8 have been machined in accordance with the shape of interconnection 8. Thermoelectric conversion module 101 thus provides highly intimate bonding of p-type thermoelectric element 5 and n-type thermoelectric element 6 to interconnection 8 and has high reliability.

Thermoelectric conversion elements 3 formed on the outer circumferential surface of inner tube 1 are covered with the coating film. This prevents or reduces the deterioration of thermoelectric conversion elements 3 caused by a heating medium, and accordingly, thermoelectric conversion module 100 is highly durable.

Thermoelectric conversion element 3 is not connected to outer tube 2. This allows a stress caused in thermoelectric conversion element 3 to be released more easily than in the case where thermoelectric conversion element 3 is connected to outer tube 2. For example, when a temperature difference is provided to thermoelectric conversion element 3, a stress is produced in thermoelectric conversion element 3 due to a difference in the coefficient of linear expansion of materials for thermoelectric conversion element 3. In particular, in thermoelectric conversion module 101 having the above configuration, a temperature di(Terence between electrode 7 and interconnection 8 of thermoelectric conversion element 3 increases, which may produce a large stress in thermoelectric conversion element 3. In contrast, since thermoelectric conversion element 3 is not connected to outer tube 2, such a stress can be released. Thermoelectric conversion module 101 thus has high reliability against thermal stress.

A longer distance L10 is preferred. The second space can be narrowed as distance L10 is increased.

The sum of shortest distance L2 between first lateral surface 5E and the top portion of first projection 41 and shortest distance IA between second lateral surface 6E and the top portion of second projection 42 is preferably smaller than distance L1 between electrode 7 (hot junction) and the second main surface. With this configuration, the sectional area of first space S1 perpendicular to first direction A is much larger than the sectional areas of second space S2 and third space S3 perpendicular to first direction A than in the case where each of distance L2 and distance L4 is smaller than distance L1 but the sum of distance L2 and distance L4 is greater than distance L1. This may produce a sufficiently large temperature difference between electrode 7 facing first space S1 and interconnection 8 not facing first space S1.

Embodiment 3

Figure 17:
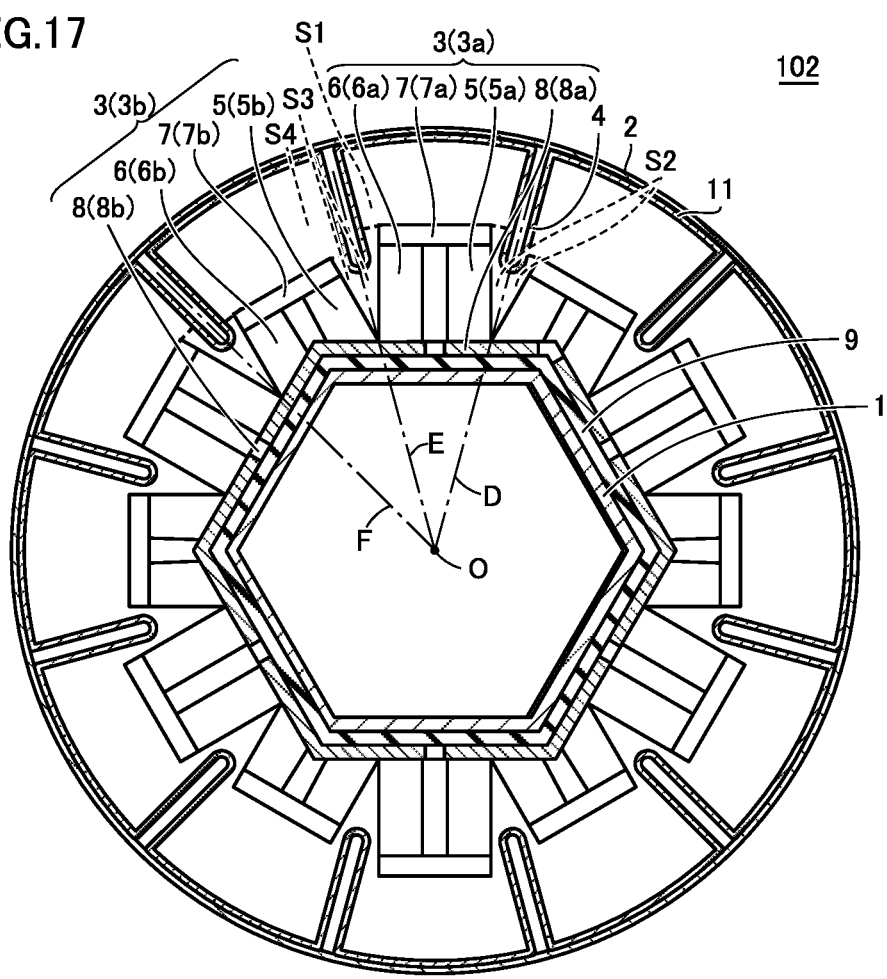
FIG. 17 is a sectional view of a thermoelectric conversion module according to Embodiment 3 which is perpendicular to a first direction A.
Figure 18:
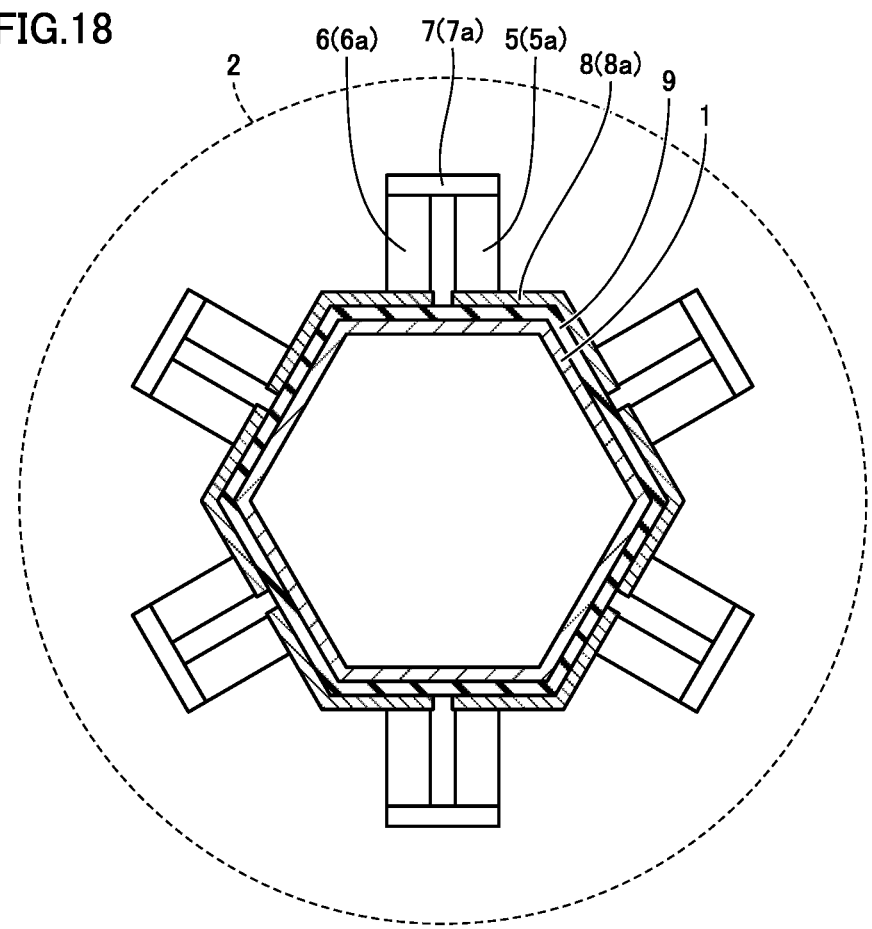
FIG. 18 is an end view of the thermoelectric conversion module according to Embodiment 3.
Figure 19:
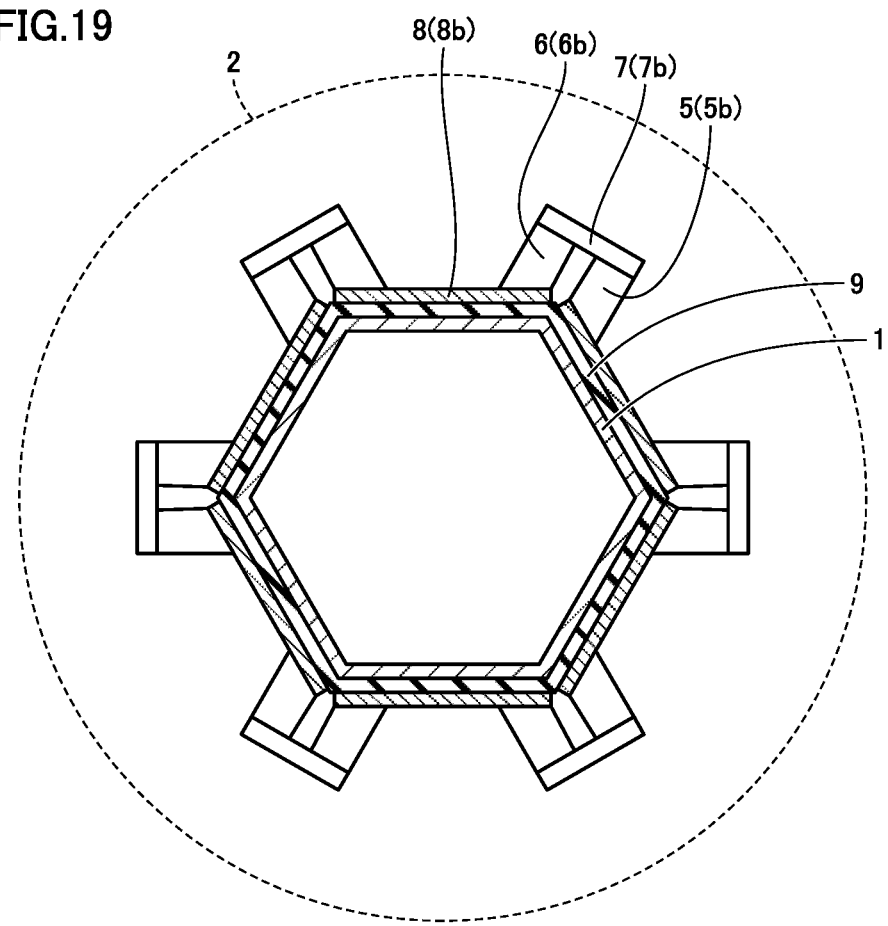
FIG. 19 is an end view of the thermoelectric conversion module according to Embodiment 3.

A thermoelectric conversion module 102 according to Embodiment 3 will now be described with reference to FIGS. 17 to 19. Thermoelectric conversion module 102 according to Embodiment 3 basically has a configuration similar to that of thermoelectric conversion module 101 according to Embodiment 1 or Embodiment 2 but differs from thermoelectric conversion module 101 in that the sectional shape of projections perpendicular to first direction A has a U shape, not a V shape. FIGS. 18 and 19 are end views corresponding to FIGS. 15 and 16 of thermoelectric conversion module 101.

Projections 4 have a width in third direction C which is uniform in second direction B, for example, except for their top portions. In this case, the distance between adjacent projections 4 increases as closer to the second main surface of outer tube 2. Such projections 4 can be formed by appropriately setting the conditions for bending plate portion 10.

First lateral surface 5k and second lateral surface 6k of thermoelectric conversion element 3a are orthogonal to, for example, the one end and the other end. First lateral surface 5k and second lateral surface 6k of thermoelectric conversion element 3b are formed so as to be orthogonal to the one end and form an acute angle with the other end. Such thermoelectric conversion elements 3 can be formed by appropriately setting the conditions for cutting with blade 20 or machining the end surface alter cutting.

Even in this case, first space S1 and fourth space S4 have sectional areas perpendicular to first direction A which are larger than those of second space S2, third space S3, and fifth space S5 Thermoelectric conversion module 102 according to Embodiment 3 can thus achieve effects similar to those of thermoelectric conversion modules 100 and 101 according to Embodiment 1 and Embodiment 2.

Thermoelectric conversion module 102 can provide a greater width of electrode 7 in third direction C than thermoelectric conversion modules 100 and 101 according to Embodiment 1 and Embodiment 2, thus providing a larger area of a surface 7u of electrode 7. Thermoelectric conversion module 102 can thus generate more electricity than thermoelectric conversion modules 100 and 101.

Since projections 4 have a U-shaped sectional shape perpendicular to first direction A, they can be formed easily by, for example, press-molding plate portion 10.

Embodiment 4

Figure 20:
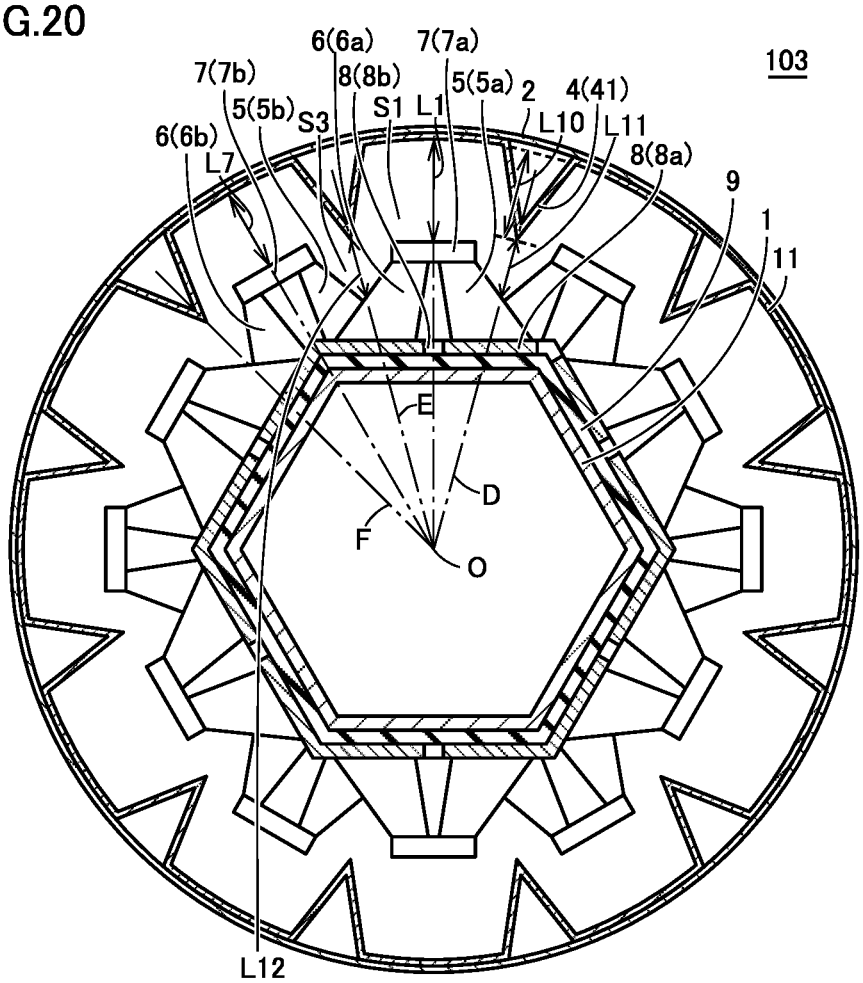
FIG. 20 is a sectional view of a thermoelectric conversion module according to Embodiment 4.
Figure 21:
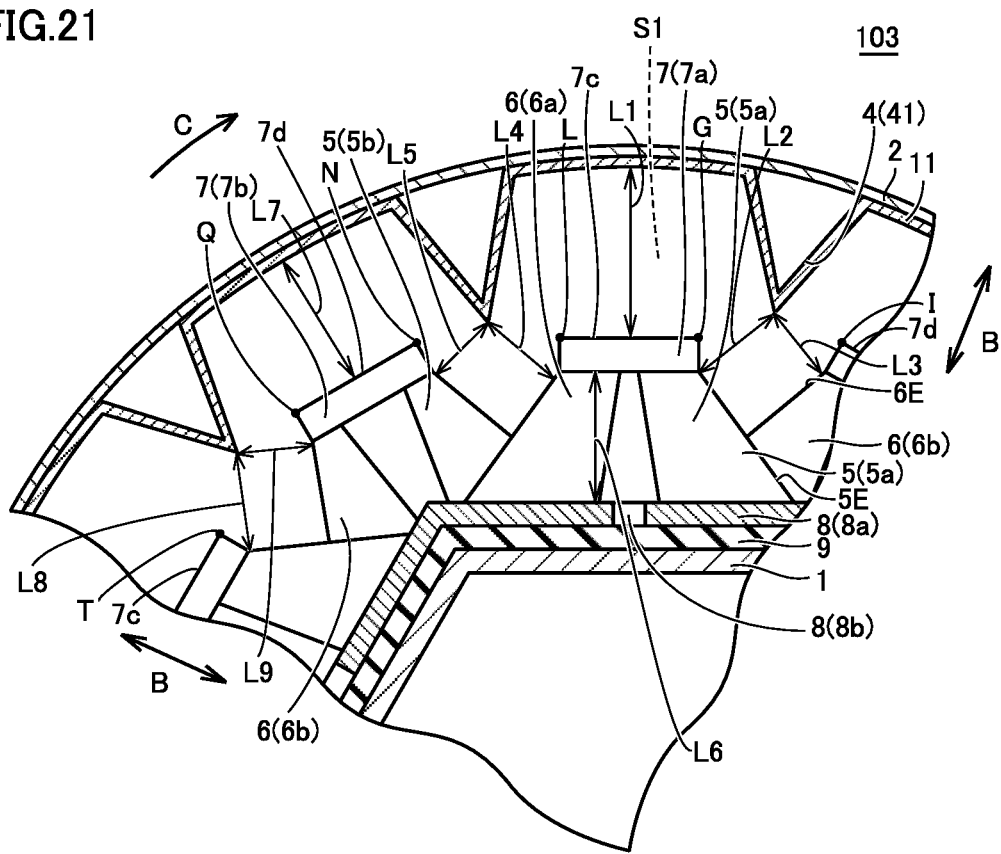
FIG. 21 is a partially enlarged view of the thermoelectric conversion module shown in FIG. 20.

A thermoelectric conversion module 103 according to Embodiment 4 will now be described with reference to FIGS. 20 and 21. Thermoelectric conversion module 103 according to Embodiment 4 basically has a configuration similar to that of thermoelectric conversion module 102 according to Embodiment 2 but differs from thermoelectric conversion module 102 in that length L10 of each of projections 4 in second direction B, that is, distance L10 from valley portion 11 to the top portion of projection 4 is smaller than distance L1.

Projections 4 are formed such that distances L2 to L5 are smaller than distances L1 and L7 as in thermoelectric conversion module 100. In other words, projections 4 are formed such that distances L11 and L12 are smaller than distances L1 and L7 Shortest distance L2 between the top portion of first projection 41 and first lateral surface 5E of p-type thermoelectric element 5a of thermoelectric conversion element 3a is smaller than distance L1 and distance L7. Shortest distance L3 between the top portion of first projection 41 and second lateral surface 6E of n-type thermoelectric element 6b of thermoelectric conversion element 3b is smaller than distance L1 and distance L7.

Shortest distance L4 between the top portion of second projection 42 and second lateral surface 6E of n-type thermoelectric element 6a of thermoelectric conversion element 3a is smaller than distance L1 and distance L7 Shortest distance L5 between the top portion of second projection 42 and first lateral surface 5h of p-type thermoelectric element 5b of thermoelectric conversion element 3b is smaller than distance L1 and distance L7.

Distance L11 between the top portion of each of projections 4 and first lateral surface 5E of p-type thermoelectric element 5 and distance L12 between the top portion of each of projections 4 and second lateral surface 6E of n-type thermoelectric element 6 in second direction B are smaller than distance L1 and distance L7.

Also with this configuration, the space facing first lateral surface 5E of p-type thermoelectric element 5 and second lateral surface 6E of n-type thermoelectric element 6 faces projection 4. Further, projections 4 allow distances L2 to L5 to be formed smaller than L1 and L7. The space facing electrode 7 thus has a sectional area in first direction A which is larger than that of the space facing first lateral surface 5E of p-type thermoelectric element 5 and second lateral surface 6E of n-type thermoelectric element 6. In thermoelectric conversion module 103, accordingly, the main flow of the heating medium circulates through the space facing electrode 7, not through the space facing first lateral surface 5E and second lateral surface 6E as in thermoelectric conversion module 100, thereby producing a sufficiently large temperature difference between electrode 7 and interconnection 8. Thermoelectric conversion module 103 thus generates more electricity than a conventional thermoelectric conversion module in which no projections 4 are formed.

Embodiment 5

Figure 22:
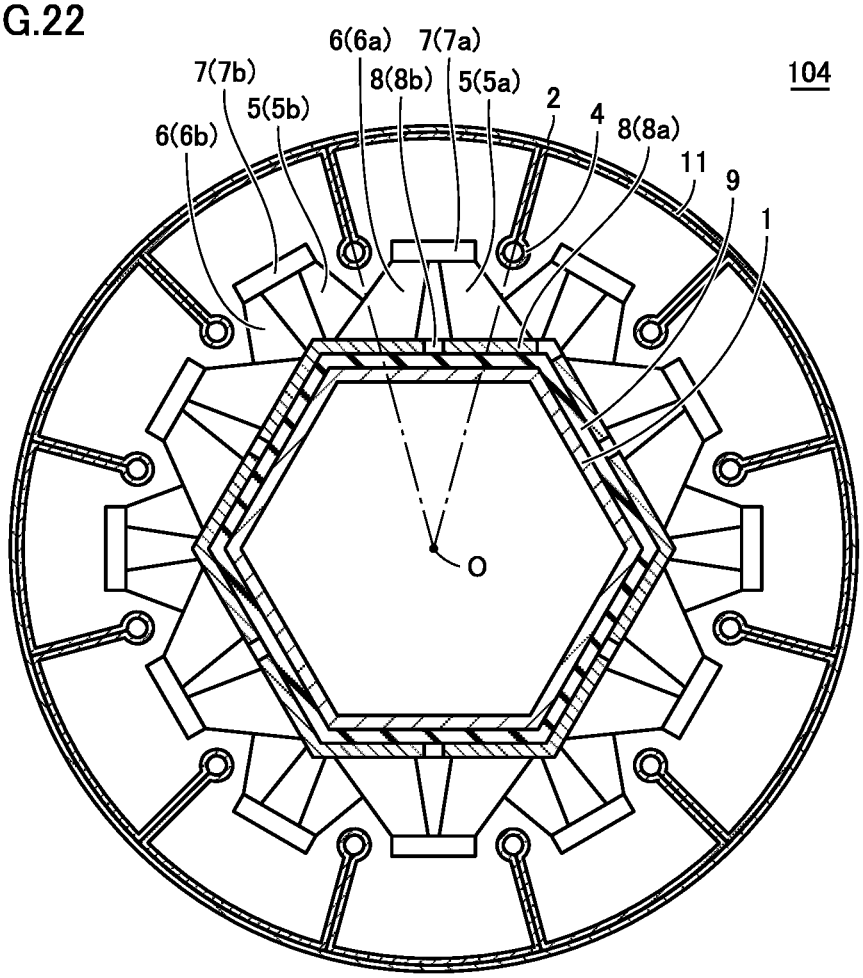
FIG. 22 is a sectional view of a thermoelectric conversion module according to Embodiment 5.

A thermoelectric conversion module 104 according to Embodiment 5 will now be described with reference to FIG. 22. Thermoelectric conversion module 104 according to Embodiment 5 basically has a configuration similar to that of thermoelectric conversion module 101 according to Embodiment 2 but differs from thermoelectric conversion module 101 in that the width of projection 4 in third direction C is greater in the top portion than in the bottom portion.

Projections 4 each have a bottom portion to which, for example, plate portion 10 is bonded without any gap, and a top portion formed of plate portion 10 bent so as to create a spacing therein. Thermoelectric conversion module 104 includes inner tube 1 (first frame body), outer tube 2 (second frame body), thermoelectric conversion elements 3 formed on the first main surface of inner tube 1, and projections 4 formed on the second main surface of outer lube 2. Thermoelectric conversion element 3 includes interconnection 8 (cold junction) formed on the first main surface, electrode 7 (hot junction) located at the side closer to the second main surface with respect to interconnection 8 and formed at distance L1 from the second main surface in second direction B. and first lateral surface 5E and second lateral surface 6E located between electrode 7 and interconnection 8. First lateral surface 5E is formed opposite to second lateral surface 6E in third direction C. Projections 4 include first projection 41 and second projection 42 formed at a spacing therebetween in third direction C when thermoelectric conversion module 104 is seen from first direction A. First projection 41 and second projection 42 each have a bottom portion connected to the second main surface and a top portion located at the side closer to the first main surface with respect to the bottom portion. Electrode 7 is formed so as to be located between first line segment D passing through the bottom portion and the top portion of first projection 41 and extending along second direction B and second line segment E passing through the bottom portion and the top portion of second projection 42 and extending along second direction B, when thermoelectric conversion module 104 is seen from first direction A. The sum of shortest distance L2 between first lateral surface 5E and the top portion of first projection 41 and shortest distance L3 between second lateral surface 6E and the top portion of second projection 42 is smaller than distance L1 between electrode 7 and the second main surface.

Also with this configuration, thermoelectric conversion module 104 has a configuration similar to that of thermoelectric conversion module 101 according to Embodiment 2, and thus can achieve effects similar to those of thermoelectric conversion module 101.

Figure 23:
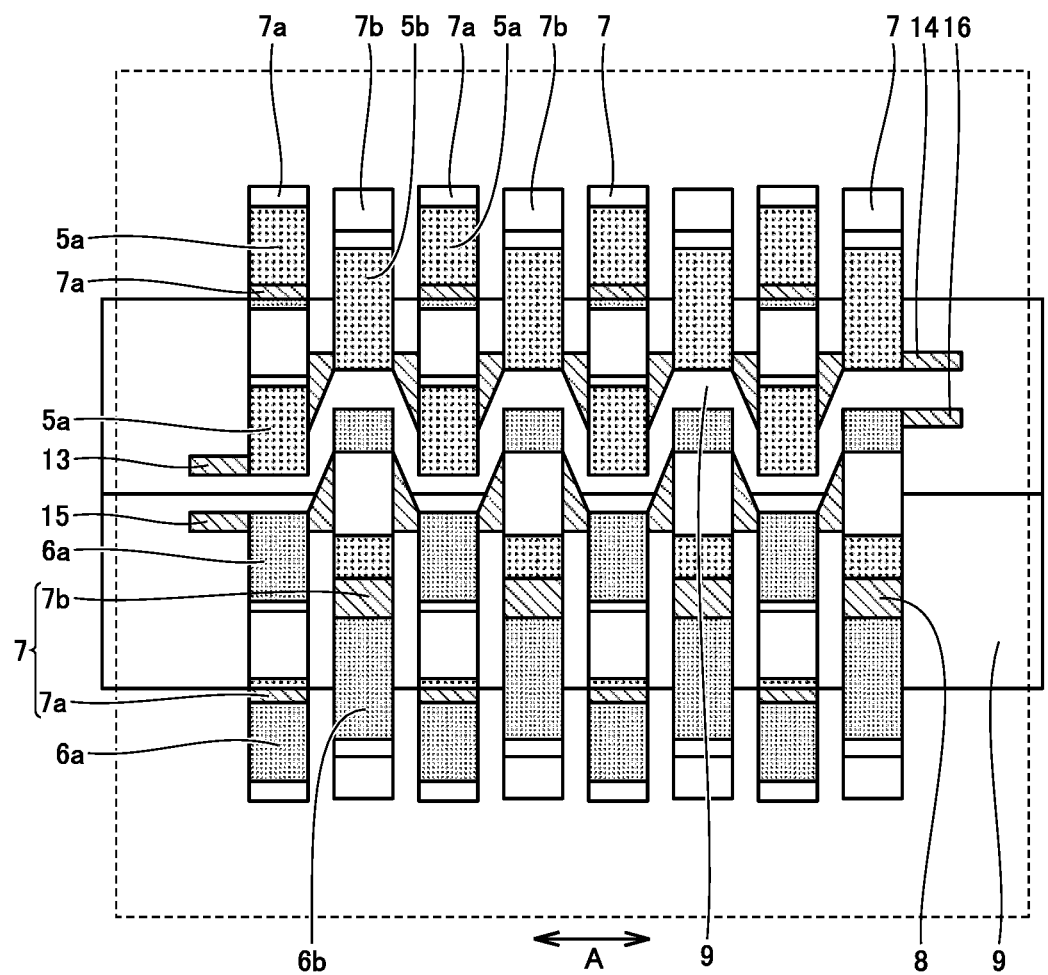
FIG. 23 is a side view of a modification of the thermoelectric conversion modules according to Embodiments 1 to 5.

It suffices that in thermoelectric conversion modules 100, 101, 102, 103, and 104 according to Embodiments 1 to 5, thermoelectric conversion elements 3 form any circuit, which is not limited to the circuitry shown in FIG. 4 or 14. For example, with reference to FIG. 23, thermoelectric conversion elements 3 formed at a spacing therebetween in first direction A may be electrically connected in parallel. In FIG. 23, for the convenience of description, p-type thermoelectric elements 5 and n-type thermoelectric elements 6 are hatched by different dots and interconnections 8 are hatched by lines, as in FIGS. 4 and 14.

Thermoelectric conversion module 100 further includes electrodes for extraction interconnection 15 and 16 electrically formed in parallel to electrodes for extraction interconnection 13 and 14, and interconnections 8c electrically formed in parallel to interconnection 8c.

Thermoelectric conversion elements 3a forming the first thermoelectric conversion element group are electrically connected in series by electrodes 7a and interconnections 8a, and thermoelectric conversion elements 3b forming the second thermoelectric conversion element group are electrically connected in series by electrodes 7b and interconnections 8b. Thermoelectric conversion elements 3a forming the first thermoelectric conversion element group and thermoelectric conversion elements 3b forming the second thermoelectric conversion element group are electrically connected in parallel to each other by interconnections 8c and 8e.

Interconnections 8c and 8c connect interconnection 8a and interconnection 8b adjacent to each other in first direction A. Specifically, interconnection 8a connected to interconnection 8c is connected only to p-type thermoelectric element 5a. Interconnection 8a connected to interconnection 8d is connected only to n-type thermoelectric element 6a.

Electrodes for extraction interconnection 13 and 15 are connected to the respective interconnections 8a adjacent to each other in third direction C. Interconnection 8a connected to electrode for extraction interconnection 13 is connected only to p-type thermoelectric element 5a Interconnection 8a connected to electrode for extraction interconnection 15 is connected only to n-type thermoelectric element 6a.

Electrodes for extraction interconnection 14 and 16 are connected to the respective interconnections 8b adjacent to each other in third direction C. Interconnection 8b connected to electrode for extraction interconnection 14 is connected only to n-type thermoelectric element 6b. Interconnection 8b connected to electrode for extraction interconnection 16 is connected only to p-type thermoelectric element 5a.

Interconnections 8c and 8d electrodes for extraction interconnection 13 and 15, electrodes for extraction interconnection 14 and 16 in third direction C are not electrically connected, so that insulating film 9 is exposed.

In thermoelectric conversion module 100, first thermoelectric conversion element groups and second thermoelectric element groups that are formed in first direction A are eclectically connected in parallel. Even when, for example, an output from some of thermoelectric conversion elements 3 cannot be obtained due to a defect, an output can thus be obtained by another first thermoelectric conversion element group and another second thermoelectric conversion element group that are formed only of defect-free thermoelectric conversion elements 3.

Although projections 4 are formed so as to extend along first direction A in thermoelectric conversion modules 100 to 104 according to Embodiments 1 to 5, the present invention is not limited to this. Projections 4 may be formed, for example, at intervals in first direction A. Alternatively, projections 4 may be formed helically with respect to central axis O. That is to say, projections 4 may be formed so as to extend in the direction crossing first direction A.

In thermoelectric conversion modules 100 to 104 according to Embodiments 1 to 5, two or more electrodes 7 may be formed so as to be located between the line segment connecting central axis O and the top portion of one of two projections 4 adjacent to each other in third direction C and the line segment connecting central axis O and the top portion of the other projection 4. Even such a thermoelectric conversion module can produce a sufficiently large temperature difference between electrode 7 and interconnection 8 compared with a conventional thermoelectric conversion module in which no projections 4 are formed.

Although all of thermoelectric conversion modules 100 to 104 according to Embodiments 1 to 5 include inner tube 1 and outer tube 2 having double pipe structure, the present invention is not limited to this. It suffices that thermoelectric conversion modules 100 to 104 include any first frame body and any second frame body forming at least part of the flow path for a heating medium. The first frame body and the second frame body may be for example, integrally formed. In this case the first frame body and the second frame body may be formed as, for example, portions of the integrally-formed frame body.

Although the embodiments of the present invention have been described above, these embodiments can be modified in various manners. The scope of the present invention is not limited to the embodiments above. The scope of the present invention is defined by the scope of the claims and is intended to include any modifications within the scope and meaning equivalent to the scope of the claims.

REFERENCE SIGNS LIST

1 inner tube, 2 outer tube, 3 thermoelectric conversion element, 4 projection, 5 p-type thermoelectric element, 6 n-type thermoelectric element, 7 electrode, 8, 13, 14 interconnection, 9 insulating film, 10 plate portion, 11 valley portion, 20 blade, 100, 101 thermoelectric conversion module.

The invention claimed is:

1. A thermoelectric conversion module that converts heat of a fluid circulating in a first direction into electrical energy, the thermoelectric conversion module comprising:
   a first frame body having a first main surface extending in the first direction;
   a second frame body facing the first main surface in a second direction crossing the first direction and having a second main surface extending in the first direction;
   at least one thermoelectric conversion element formed on the first main surface; and
   a plurality of projections formed on the second main surface,
   the thermoelectric conversion element including
      a cold junction formed on the first main surface,
      a hot junction located at a side closer to the second main surface with respect to the cold junction and formed at a first distance from the second main surface in the second direction, and
      a first lateral surface and a second lateral surface formed between the hot junction and the cold junction, the first lateral surface and the second lateral surface being formed at a spacing therebetween in a third direction crossing the first direction and the second direction,
   the plurality of projections including a first projection and a second projection formed at a spacing therebetween in the third direction when the thermoelectric conversion module is seen from the first direction,
   the first projection being formed at a spacing from the first lateral surface in the second direction,
   the second projection being formed at a spacing from the second lateral surface in the second direction,
   the first projection and the second projection each having a bottom portion connected to the second main surface and a top portion located at a side closer to the first main surface with respect to the bottom portion,
   the hot junction being formed to be located between a first line segment and a second line segment when the thermoelectric conversion module is seen from the first direction, the first line segment passing through the bottom portion and the top portion of the first projection and extending along the second direction, the second line segment passing through the bottom portion and the top portion of the second projection and extending along the second direction,
   a shortest distance between the first lateral surface and the top portion of the first projection and a shortest distance between the second lateral surface and the top portion of the second projection being each smaller than the first distance.

2. The thermoelectric conversion module according to claim 1, wherein a sum of the shortest distance between the first lateral surface and the top portion of the first projection and the shortest distance between the second lateral surface and the top portion of the second projection is smaller than the first distance.

3. The thermoelectric conversion module according to claim 2, comprising a plurality of the thermoelectric conversion elements, wherein
   the plurality of thermoelectric conversion elements are formed at a spacing therebetween in the third direction when the thermoelectric conversion module is seen from the first direction,
   the first projection and the second projection are formed such that when the thermoelectric conversion module is seen from the first direction, the first line segment and the second line segment each pass through between the hot junctions of two of the plurality of thermoelectric conversion elements adjacent to each other in the third direction,
   when the thermoelectric conversion module is seen from the first direction, a first space is formed in a region that is located between the first line segment and the second line segment and is within the first distance from the second main surface in the second direction, when the thermoelectric conversion module is seen from the first direction, a second space is formed in a region facing the first lateral surface of one thermoelectric conversion element of two of the thermoelectric conversion elements adjacent to each other in the third direction so as to sandwich the first line segment and the second lateral surface of the other thermoelectric conversion element, the region being away from the second main surface by more than the first distance in the second direction, when the thermoelectric conversion module is seen from the first direction, a third space is formed in a region facing the first lateral surface of one thermoelectric conversion element of two of the thermoelectric conversion elements adjacent to each other in the third direction so as to sandwich the second line segment and the second lateral surface of the other thermoelectric conversion element, the region being away from the second main surface by more than the first distance in the second direction, and the first space has a sectional area perpendicular to the first direction which is larger than that of any of the second space and the third space.

4. The thermoelectric conversion module according to claim 1, wherein the projections each have a length in the second direction which is greater than the first distance.

5. The thermoelectric conversion module according to claim 1, wherein the bottom portion of each of the projections has a width in the third direction which is smaller than or equal to a width of the top portion in the third direction.

6. The thermoelectric conversion module according to claim 2, comprising:
a first thermoelectric conversion element group formed of a plurality of the thermoelectric conversion elements formed side by side along the third direction; and
a second thermoelectric conversion element group formed of a plurality of the thermoelectric conversion elements formed side by side along the third direction and being adjacent to the first thermoelectric conversion element group in the first direction, wherein
the first thermoelectric conversion element group and the second thermoelectric conversion element group are formed such that the hot junctions thereof are formed alternately in the third direction when the thermoelectric conversion module is seen from the first direction, and
the plurality of projections are formed such that when the thermoelectric conversion module is seen from the first direction, the first line segment and the second line segment each pass through between the hot junctions of the first thermoelectric conversion element group and the hot junctions of the second thermoelectric conversion element adjacent to each other in the third direction.

7. The thermoelectric conversion module according to claim 1, wherein
the first frame body and the second frame body are tube portions extending in the first direction,
the first frame body is housed in the second frame body, and
the first main surface is an outer circumferential surface of the first frame body, and the second main surface is an inner circumferential surface of the second frame body.

8. A method of manufacturing a thermoelectric conversion module that converts heat of a fluid circulating in a first direction into electrical energy, the method comprising:
preparing a first frame body having a first main surface extending in the first direction and including at least one thermoelectric conversion element formed on the first main surface;
preparing a second frame body having a second main surface extending in the first direction and including a plurality of projections formed on the second main surface; and
fixing the first frame body and the second frame body to each other such that the first main surface and the second main surface face each other in a second direction crossing the first direction,
in the preparing of the first frame body, the thermoelectric conversion element is formed, the thermoelectric conversion element including
a cold junction formed on the first main surface,
a hot junction formed at a second distance from the cold junction in the second direction, and
a first lateral surface and a second lateral surface located between the hot junction and the cold junction, the first lateral surface and the second lateral surface being formed at a spacing therebetween in a third direction crossing the first direction and the second direction,
in the preparing of the second frame body, the projections including a first projection and a second projection formed at a spacing therebetween in the third direction being formed when the thermoelectric conversion module is seen from the first direction, the first projection and the second projection each having a bottom portion connected to the second main surface and a top portion located at a side closer to the first main surface with respect to the bottom portion,
in the fixing,
the first projection and the first lateral surface being arranged at a spacing therebetween in the second direction, the second projection and the second lateral surface being arranged at a spacing therebetween in the second direction,
the first frame body and the second frame body being positioned such that the hot junction is located between a first line segment and a second line segment when the thermoelectric conversion module is seen from the first direction, the first line segment passing through the bottom portion and the top portion of the first projection and extending along the second direction, the second line segment passing through the bottom portion and the top portion of the second projection and extending along the second direction,
the first frame body and the second frame body being positioned such that a shortest distance between the first lateral surface and the top portion of the first projection and a shortest distance between the second lateral surface and the top portion of the second projection are each smaller than a shortest distance between the hot junction and the second main surface.

* * * * *